United States Patent
Okamoto et al.

[11] Patent Number: 6,163,366
[45] Date of Patent: Dec. 19, 2000

[54] EXPOSURE METHOD AND APPARATUS

[75] Inventors: Hiroki Okamoto; Masaharu Kawakubo; Shinji Mizutani, all of Kawasaki, Japan

[73] Assignee: Nikon Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/968,422

[22] Filed: Nov. 12, 1997

Related U.S. Application Data

[63] Continuation of application No. 08/712,842, Sep. 12, 1996, abandoned.

[30] Foreign Application Priority Data

Sep. 13, 1995 [JP] Japan ................................. 7-235690
Sep. 28, 1995 [JP] Japan ................................. 7-250486

[51] Int. Cl.[7] ........................................ G03B 27/32
[52] U.S. Cl. ........................ 355/53; 355/53.5; 356/401
[58] Field of Search ........................... 355/43–45, 53, 355/67, 68, 77; 356/124, 400, 401; 250/548, 557

[56] References Cited

U.S. PATENT DOCUMENTS

| | | | |
|---|---|---|---|
| 4,734,746 | 3/1988 | Ushida et al. | 355/53 |
| 4,769,523 | 9/1988 | Tanimoto et al. | 356/400 |
| 4,780,617 | 10/1988 | Umatate et al. | 250/548 |
| 4,943,733 | 7/1990 | Mori et al. | 250/548 |
| 5,117,255 | 5/1992 | Shiraishi et al. | 355/53 |
| 5,402,224 | 3/1995 | Hirukawa et al. | 355/53 |
| 5,448,333 | 9/1995 | Iwamoto et al. | 355/53 |

FOREIGN PATENT DOCUMENTS 6-275496  9/1994  Japan .

*Primary Examiner*—D. Rutledge
*Attorney, Agent, or Firm*—Foley & Lardner

[57] ABSTRACT

In the exposure method and apparatus, the distortion data of the projection lens in each exposure unit itself has already been known for each exposure unit. Accordingly, when the exposure unit which formed the alignment target layer has already been known, the known data of this exposure unit is used to correct at least one of the projection magnification and shot rotation determined according to multipoint EGA operation, and the exposure apparatus is adjusted by the amount of this correction. When the exposure unit forming the alignment target layer is unknown, the alignment mark exposure unit is specified from the state of distribution of non-linear error computed from the alignment mark measured values within a shot. Under thus determined correct projection magnification and shot rotation, a shot area is accurately overlaid with and exposed to a reticle pattern.

55 Claims, 11 Drawing Sheets

EXPOSURE METHOD AND APPARATUS

This application is a continuation of application Ser. No. 08/712,842, filed Sep. 12, 1996, now abandoned.

BACKGROUND OF THE INVENTION

1. Field of the Invention

The present invention relates to an exposure method and apparatus and, in particular, to an exposure method and apparatus in which a pattern of a mask or reticle is projected onto a substrate to be processed in a lithography step. Here, the lithography step is a step in a process for making semiconductor devices, imaging devices (CCD and the like), liquid crystal display devices, thin-film magnetic heads, semiconductor integrated circuits, and the like.

2. Related Background Art

When a semiconductor device, a liquid crystal display device, or the like is to be manufactured, in a photolithography step, used is a projection exposure apparatus such as stepper. The projection exposure apparatus projects and transfers, by way of a projection optical system, a pattern of a mask or reticle onto each shot area on a wafer, a glass plate, or the like which is coated with photoresist. In a semiconductor device, a number of layers of circuit patterns are formed on a wafer as being laminated on each other with a predetermined positional relationship. Accordingly, when the circuit pattern of the second or later layer is to be projected onto the wafer, it is necessary to accurately align the reticle pattern to be projected with each shot area on the wafer where a circuit pattern has already been formed. Therefore, the conventional projection exposure apparatus has been configured such that an alignment sensor detects the position of a wafer mark provided at a predetermined shot area (already formed chip pattern) and, based on the result of detection, performs alignment of the individual shot areas. Here, it is important to accurately perform the alignment with respect to the shot area and adjust the exposure apparatus.

Also, on the wafer, a number of shot areas are regularly arranged according to a preset arrangement coordinates, while each shot area has a chip pattern formed therein including an alignment mark used for alignment thereof. As a method of aligning a reticle pattern with a shot area of a wafer, enhanced global alignment method (referred to as "multipoint EGA method" or "EGA method" hereinafter) is disclosed, for example, in Japanese Patent Laid-Open No. 6-275496 (U.S. patent application Ser. No.08/254,524) and U.S. Pat. No. 4,780,617. In particular in the former document, magnification, rotation, or the like of a chip are also taken into consideration.

In the following, the alignment according to the multipoint EGA method will be explained. In this method, the arrangement coordinates of a shot to be aligned, magnification of the chip, rotation thereof, and the like are computed according to a statistical arithmetic technique assuming that errors between the measured positions of alignment marks respectively disposed at a plurality of points within the shot area and their designed positions are caused by the following factors (1) to (7):

(1) residual rotational error $\Theta$ of the wafer;

(2) orthogonality error W of a stage coordinate system (or shot arrangement);

(3) linear expansion or contraction Rx and Ry of the wafer;

(4) offset (translation) $O_x$ and $O_y$ of the center position of the wafer;

(5) residual rotational error $\theta$ of the chip pattern on each shot area of the wafer;

(6) orthogonality error w of a coordinate system (chip pattern) on the wafer; and (7) linear expansion or contraction rx and ry with respect to two directions of the chip pattern orthogonal to each other.

Here, the error parameters $\Theta$, W, Rx, Ry, $O_x$, and $O_y$ are defined with respect to the stage coordinate system (X, Y), whereas the error parameters $\theta$, w, rx, and ry are defined with respect to the coordinate system (x, y) of the shot area.

Assuming that the designed coordinate value of a reference point (e.g., shot center) on a coordinate system ($\alpha,\beta$) on the wafer in each of a plurality of shot areas selected on the wafer is $C_n$, that the designed coordinate value (relative coordinate value) of the measured alignment mark in the coordinate system (x, y) on each shot area is $S_{Nn}$, and that the calculated value of the alignment mark to be disposed on the stage coordinate system (X, Y) is $F_{Nn}$, $F_{Nn}$ is represented by the following expression (1):

$$F_{Nn} = AC_n + BS_{Nn} + O \tag{1}$$

wherein the individual vectors and transformation matrices in the above expression are defined as shown in the following expression (2). Here, the residual rotational error $\Theta$ of the wafer, orthogonality error W, residual rotational error $\theta$ of the chip pattern, and orthogonality error w are linearly approximated assuming that they are of minute quantities; while approximation is performed by:

$$Rx=1+\Gamma x, \ Ry=1+\Gamma y,$$

$$rx=1+\gamma x, \ ry=1+\gamma y$$

assuming that $\gamma x$, $\gamma y$, $\gamma x$, and $\gamma y$ are of minute quantities.

$$F_{Nn} = \begin{bmatrix} F_{NXn} \\ F_{NYn} \end{bmatrix}, \qquad A = \begin{bmatrix} 1+\Gamma x & -(W+\Theta) \\ \Theta & 1+\Gamma y \end{bmatrix} \tag{2}$$

$$B = \begin{bmatrix} 1+\gamma x & -(w+\theta) \\ \theta & 1+\gamma y \end{bmatrix}, \quad O = \begin{bmatrix} O_X \\ O_Y \end{bmatrix}$$

$$C_n = \begin{bmatrix} C_{Xn} \\ C_{Yn} \end{bmatrix}, \qquad S_{Nn} = \begin{bmatrix} S_{NXn} \\ S_{NYn} \end{bmatrix}$$

Then, 10 error parameters ($\Theta$, W, $\Gamma x$, $\Gamma y$, $O_x$, $O_y$, $\theta$, w, $\gamma x$, and $\gamma y$) satisfying expression (1) are determined by least square method. Specifically, the difference ($E_{NXn}$, $E_{NYn}$) between an actually measured coordinate value ($FM_{NXn}$, $FM_{NYn}$) and its calculated coordinate value ($F_{NXn}$, $F_{NYn}$) is considered to be an alignment error. Thus, $EN_{NXn} = FM_{NXn} - F_{NXn}$, and $EN_{NYn} = FM_{NYn} - F_{NYn}$. Also, the sum of squares of five or more sets of alignment errors ($E_{NXn}$, $E_{NYn}$), namely, 10 or more values of alignment errors, is partially differentiated with the above-mentioned 10 parameters in succession; equations are established so as to minimize the resulting differentiated values; and then these 10 simultaneous equations are solved by least square method; whereby the 10 error parameters can be determined.

Thereafter, the reticle is appropriately rotated or the wafer is rotated so as to correct the rotational error $\theta$ of the chip rotation in the above-mentioned transformation matrix B, thereby correcting the rotation of the chip pattern with respect to the stage coordinate system (X, Y). Though the orthogonality error w cannot be corrected in its strict sense, the error can be minimized when the reticle is appropriately rotated. Therefore, the amount of rotation of reticle or wafer can be optimized such that the sum of respective absolute values of the residual rotational error Θ of the wafer, residual rotational error θ of the chip pattern, and orthogonality error w is minimized.

Thereafter, the magnification of projection of the projection optical system is adjusted so as to correct the chip scaling errors γx and γy in the transformation matrix B. Subsequently, the transformation matrices A and O are used such that a designed arrangement coordinate value ($C_{xn}$, $C_{yn}$) of the reference point in each shot area is input into the following expression (3), so as to determine a calculated arrangement coordinate value ($G_{xn}$, $G_{yn}$) of the reference point on the stage coordinate (X, Y).

$$\begin{bmatrix} G_{Xn} \\ G_{Yn} \end{bmatrix} = A \begin{bmatrix} C_{Xn} \\ C_{Yn} \end{bmatrix} + O \quad (3)$$

Then, based on thus calculated arrangement coordinates ($G_{xn}$, $G_{yn}$) and a predetermined baseline amount, the reference point of each shot area on the wafer is sequentially aligned with a predetermined position within the exposure field of the projection optical system, and the pattern image of the reticle is projected onto the shot area. After all the shot areas on the wafer are exposed to the pattern image, a processing such as development of the wafer is effected.

According to the alignment of this multipoint EGA method, since not only the tranformation matrices A and O but also the transformation matrix B including the respective parameters for chip rotation, orthogonality error of the chip, and chip scaling is taken into account, influence of expansion and contraction, roration, or the like of the chip pattern itself which is transferred to each shot area can be minimized so that the chip pattern of each shot area on the wafer and the projected image of the reticle pattern are overlaid with each other more accurately.

In the alignment of the above-mentioned multipoint EGA method, alignment marks positioned at a plurality of points within a shot are measured in order to determine errors within the shot, i.e., parameters for chip rotation, orthogonality error of the chip, and chip scaling. The coordinate values of thus measured alignment marks, however, include errors caused by lens distortion in its alignment target layer exposure unit. Accordingly, when thus measured value is used as it is, while the reticle or wafer is rotated so as to correct the rotational error θ of chip rotation or the projection magnification of the projection optical system is adjusted so as to correct the chip scaling errors γx and γy, there have been problems that shot magnification errors or shot ratation errors occur.

Also, recently, in order to increase throughput (number of wafer sheets processed per unit time), different exposure apparatuses have been used respectively for different layers on the wafer so as to effect exposure in a mix-and-match method. In this case, when the magnification of the projection image of the projection exposure apparatus used for the exposure of the first layer on the wafer differs from that of the projection exposure apparatus used for the exposure of the second layer on the wafer, overlay accuracy deteriorates between these two layers. Accordingly, in order to improve the overlay accuracy, for example, a plurality of wafer marks disposed within a predetermined shot area on the wafer with a predetermined positional relationship, respectively indicating two-dimensional positions, have been detected so as to determine the linear magnification error of the pattern in the first layer within each shot area, whereby the magnification of the projection optical system of the projection exposure apparatus to be subsequently used has been corrected in response to this linear magnification error. Here, such a method in which positions of a plurality of wafer marks are detected within one shot area as being converted into two-dimensional marks has also been known as in-shot multipoint alignment measurement method.

As mentioned above, in the conventional exposure method of mix-and-match type, there have been cases where, upon exposure of the second layer in each shot area on the wafer, the magnification of the projected image is corrected in response to the magnification of the pattern of the first layer. Nevertheless, distortion (non-linear magnification error) characteristics in the projection exposure apparatuses used for exposure of these two layers have not been taken into account in particular. Therefore, when such distortion characteristics greatly differ from each other, the overlay accuracy between these two layers have disadvantageously deteriorated. This phenomenon will be explained with reference to FIGS. 12, 13A, and 13B.

FIG. 12 shows an example of distortion in a projected image in a conventional projection exposure apparatus. In this drawing, an image formed when a predetermined square original pattern is projected onto a wafer by way of a projection optical system, which is free of distortion and linear magnification error and has a predetermined magnification (e.g., 1/5), is depicted with dotted lines as a reference pattern 56; whereas an image formed when this original pattern is projected onto a first layer on the wafer by way of a projection optical system having a pin-cushion type distortion is depicted with continuous curves as a projection pattern 65. When the distortion characteristic of the projection pattern 65 is to be measured, amounts of positional deviation of the projection pattern 65 from its ideal position (reference pattern 56 in this case) are measured at four measurement points 57A to 57D respectively at the centers of the four sides of the reference pattern 56 and four measurement points 58A to 58D on four apexes of the reference pattern 56, for example. Then, the distortion characteristic of the projection pattern 65 is substantially specified by the amounts of positional deviation at these eight measurement points 57A to 57D and 58A to 58D or, desirably, more measurement points.

On the other hand, when positions of a plurality of wafer marks within a predetermined shot area on a wafer are detected by way of an alignment sensor according to the in-shot multipoint alignment measurement method, since there is not so much room for forming wafer marks within each shot area and there is necessity for shortening measurement time, positional detection of wafer marks is effected at only two or four measurement points, for example. Accordingly, as compared with the number of points required for specifying the distortion characteristic, the number of measurement points employed by the alignment sensor is considerably smaller, thereby making it difficult to perform correction in response to distortion.

Specifically, it is assumed that the projection optical system of the projection exposure apparatus used for exposing the second layer on the wafer to light is free of distortion and linear magnification error. Then, when the amounts of positional deviation of the wafer mark are measured at the four measurement points 57A to 57D on the reference pattern 56 in FIG. 12, the projection pattern judged from the result of this measurement becomes a small projection pattern 66 depicted in FIG. 13A. Accordingly, when exposure of the second layer is effected at a magnification corresponding to the projection pattern 66, the overlay error between the projection pattern 65 of the first layer and the projection pattern 66 of the second layer is made large.

Also, when the amounts of positional deviation of the wafer mark are measured at the measurement points 58A to 58D on the four apexes of the reference pattern 56 in FIG. 12, the projection pattern judged from the result of this measurement becomes a large projection pattern 67 depicted in FIG. 13B. Accordingly, when exposure of the second layer is effected at a magnification corresponding to the projection pattern 67, the overlay error between the projection pattern 65 of the first layer and the projection pattern 67 of the second layer is made large.

Thus, since distortion of projection lenses is not taken into account in the conventional exposure method, there have been problems that shot magnification error and shot rotation error may occur. Also, even when the in-shot multipoint alignment measurement method is adopted, there has been an inconvenience that the overlay accuracy between two layers on the wafer may greatly fluctuate upon positions and number of measurement points employed by the alignment sensor.

SUMMARY OF THE INVENTION

It is an object of the present invention to provide an exposure method and apparatus which can accurately overlay a reticle pattern with a shot area without being influenced by lens distortion in its alignment target layer exposure unit.

It is also an object of the present invention to provide an exposure method and apparatus which can attain a high overlay accuracy in the case where a plurality of different exposure apparatuses are respectively used for a plurality of layers on a wafer so as to effect overlaying exposure, even when distortion characteristics for projection images in these plurality of exposure apparatuses differ from each other.

Namely, the present invention provides an exposure method in which a plurality of reticle patterns are sequentially overlaid with and projected onto a plurality of shot areas formed on a substrate to be processed, which method comprises the steps of measuring positions of a plurality of alignment marks formed within the shot areas; computing, from thus measured positions of the alignment marks and designed positions of the alignment marks, an error therebetween; determining, from a predetermined distortion data of a projection lens used for forming the alignment marks and the error, an amount of positional deviation of a projection image of a reticle pattern; correcting, based on thus determined amount of positional deviation, the projection image of the reticle pattern; and performing exposure with thus corrected projection image.

In the present invention, the distortion data of the projection lens in each exposure apparatus (exposure unit) itself has been measured beforehand and known for each exposure unit. Accordingly, when the exposure unit which formed the alignment target layer has already been known, the known lens distortion data of this exposure unit can be used so as to correct at least one of the projection magnification and shot rotation determined from the measured alignment target position. The shot area is exposed to the reticle pattern with a high overlay accuracy under thus determined correct projection magnification and shot rotation.

Also, the present invention provides an exposure method in which a plurality of reticle patterns are sequentially overlaid with and projected onto a plurality of shot areas formed on a substrate to be processed, which method comprises the steps of measuring positions of a plurality of alignment marks formed within the shot areas; computing, from thus measured positions of alignment marks and designed position of the alignment marks, an error therebetween; comparing known distortion data of a plurality of projection lenses and the error with each other so as to specify the projection lens used for forming the alignment marks; using the distortion data of thus specified projection lens and the error so as to correct a projection image of the reticle pattern; and performing exposure with thus corrected projection image.

When the alignment target layer exposure unit is unknown, it is initially specified from the alignment mark measured values within a shot. For this purpose, non-linear error is computed from the alignment mark measured values within the shot according to a statistical processing (calculation technique of multipoint EGA method). Since the non-linear error within the shot is considered to be influenced by lens distortion of an exposure unit, it can be specified from the state of distribution of non-linear error which projection lens (exposure unit) is used for exposing the alignment target layer to light. Then, based on the distortion data of thus specified projection lens, at least one of the projection magnification and shot rotation determined from the alignment mark measured values within the shot can be corrected.

Also, the present invention provides an exposure method in which a plurality of reticle patterns are sequentially overlaid with and projected, by a plurality of exposure apparatuses, onto a plurality of shot areas formed on a substrate to be processed, which method comprises the steps of determining distortion data of projection images respectively formed by the plurality of exposure apparatuses; storing thus determined distortion data; determining an amount of positional deviation of the projection image of the first reticle pattern formed by the first exposure apparatus at a predetermined measurement point on the substrate before exposure of the second layer on the substrate is performed by the second exposure apparatus; correcting, based on the distortion data and the amount of positional deviation, the projection image formed by the second exposure apparatus; and performing exposure by the second exposure apparatus with thus corrected projection image.

In accordance with this aspect of the present invention, the initial value for magnification of the second exposure apparatus for optimizing the overlay accuracy is determined, for example, from distortion data which have been stored beforehand. Then, this initial value for magnification is corrected on the basis of the amounts of positional deviation in the projection image of the first mask pattern actually measured at a plurality of measurement points on the substrate to be processed, whereby the magnification can be determined more accurately.

Also, the present invention provides an exposure apparatus which projects, by way of a projection optical system, a pattern of a reticle onto a substrate to be processed, which apparatus comprises a reticle stage for holding the reticle; an illumination optical system for irradiating the reticle with exposure light; a stage for mounting the substrate thereon; a projection optical system for projecting a pattern image of the reticle transmitted through the reticle onto the substrate; an alignment system for determining a position of an alignment mark formed on the substrate; an arithmetic means for determining, from thus determined position of the alignment mark and a designed position of the alignment mark, an error therebetween; and a projection image correcting means for correcting a projection image of the reticle pattern by using a predetermined distortion data of a projection lens used for forming the alignment mark and the error.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

In the following, embodiments of the exposure apparatus and method in accordance with the present invention will be explained with reference to drawings. Here, among the drawings, parts identical or equivalent to each other are referred to with marks identical to each other without their overlapping explanations being repeated.

Embodiment 1

Figure 1:
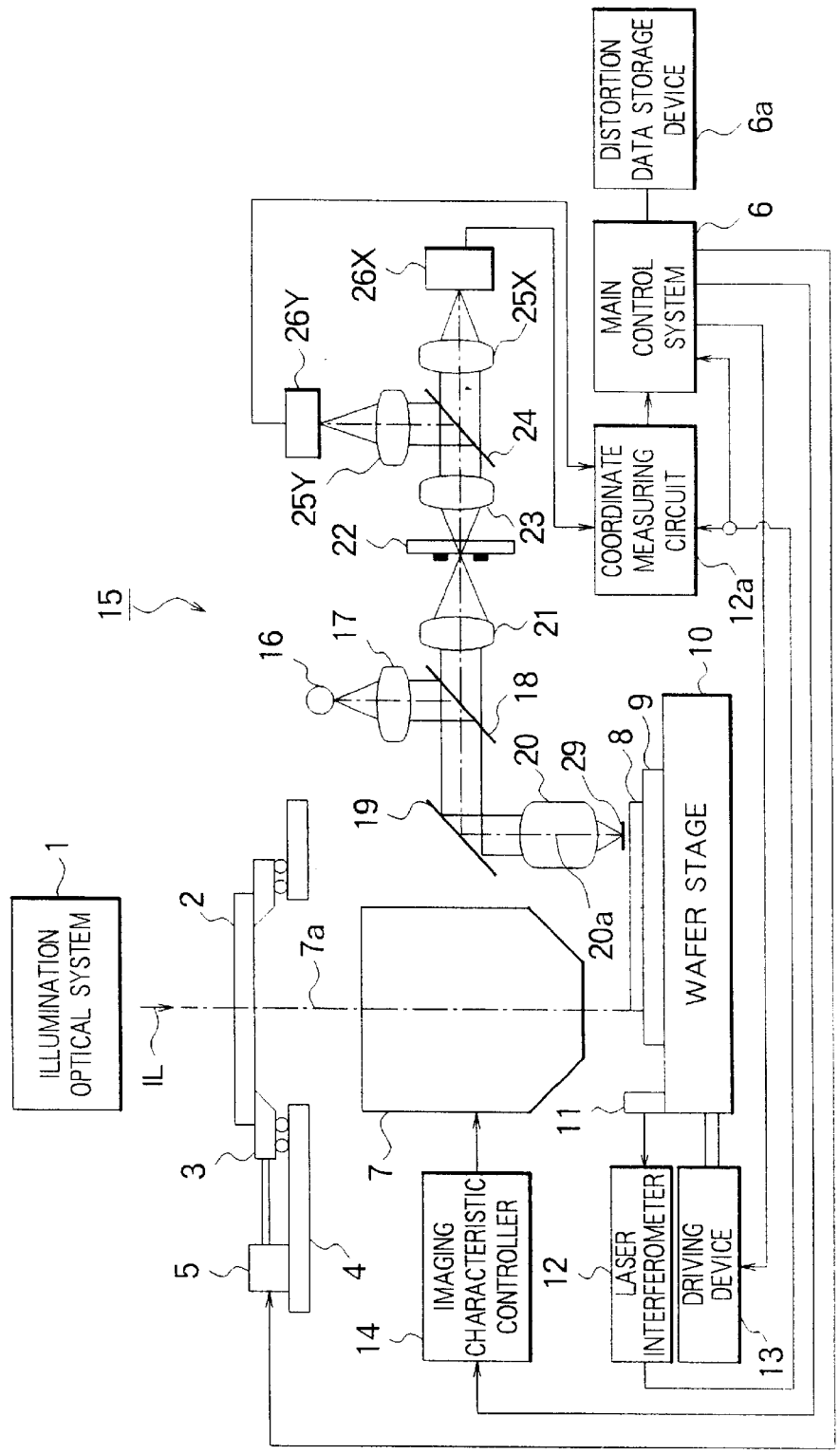
FIG. 1 is a schematic configurational view showing an exposure apparatus according to Embodiment 1 of the present invention.

FIG. 1 shows a schematic configurational view showing an exposure apparatus (stepper) which exposes each shot area on a wafer, which is a substrate to be processed such as photosensitive substrate, to a pattern of a reticle by a step-and-repeat method, for example. In FIG. 1, exposure light IL emitted from an illumination optical system 1 irradiates a reticle (or mask) 2 with a substantially uniform illuminance. The reticle 2 is held on a reticle stage 3, which is supported so as to be movable and minutely rotatable within a two-dimensional plane on a base 4. A main control system 6 for controlling the operation of the whole apparatus controls the operation of the reticle stage 3 by way of a driving device 5 disposed on the base 4.

Under the exposure light IL, a pattern image of the reticle 2 is projected onto each shot area on a wafer 8 by way of a projection optical system 7. The wafer 8 is mounted on a wafer stage 10 by way of a wafer holder 9. The wafer stage 10 is constituted by an XY stage for two-dimensionally positioning the wafer 8 within a plane perpendicular to an optical axis 7a of the projection optical system 7; Z stage for positioning the wafer 8 in a direction (Z direction) in parallel to the optical axis 7a of the projection optical system 7; a stage for minutely rotating the wafer 8; and the like.

A movable mirror 11, which moves together with the stage, is fixed to the upper surface of the wafer stage 10; whereas a laser interferometer 12 is disposed so as to face the movable mirror 11. Though depicted as simplified form in FIG. 1, assuming that the orthogonal coordinate system within a plane perpendicular to the optical axis 7a of the projection optical system 7 is defined by X axis and Y axis, the movable mirror 11 is constituted by a plane mirror having a reflecting surface perpendicular to X axis and a plane mirror having a reflecting surface perpendicular to Y axis. Also, the laser interferometer 12 is constituted by two laser interferometers for X axis, irradiating the movable mirror 11 with laser beams along X axis, and a laser interferometer for Y axis, irradiating the movable mirror 11 with a laser beam along Y axis. The X-coordinate and Y-coordinate of the wafer stage 10 are respectively measured by one laser interferometer for X axis and the one laser interferometer for Y axis. The coordinate system (X, Y) composed of thus measured X and Y coordinates will be referred to as "stage coordinate system" or "static coordinate system" hereinafter.

Also, the rotational angle of the wafer stage 10 is measured by a difference between respectively measured values of the two laser interferometers for X axis. Information about the X-coordinate, Y-coordinate, and rotational angle measured by the laser interferometer 12 is supplied to a coordinate measuring circuit 12a and the main control system 6. While monitoring the supplied coordinates, the main control system 6 controls the positioning operation of the wafer stage 10 by way of a driving device 13. Though not depicted in FIG. 1, an interferometer system identical to that on the wafer side is also disposed on the reticle side.

An imaging characteristic controller 14 is attached to the projection optical system 7. By adjusting the distance between predetermined lens groups within those constituting the projection optical system 7 or adjusting the pressure of gas within a lens chamber between predetermined lens groups, for example, the imaging characteristic controller 14 adjusts the projection magnification, distortion, or the like of the projection optical system 7. The operation of the imaging characteristic controller 14 is also controlled by the main control system 6. The distortion data of alignment mark exposure units are stored in a distortion data storage device 6a connected to the main control system 6.

Further, on a side of the projection optical system 7, an off-axis alignment system 15 is disposed. In this alignment system 15, by way of a collimator lens 17, a beam splitter 18, a mirror 19, and an objective lens 20, illumination light from a light source 16 irradiates the proximity of an alignment mark 29 formed on the wafer 8. Here, a baseline amount, which is the distance between an optical axis 20a of the objective lens 20 and the optical axis 7a of the projection optical system 7, has been measured beforehand. Then, by way of the objective lens 20, the mirror 19, the beam splitter 18, and a condenser lens 21, the reflected light from the alignment mark 29 irradiates an index plate 22, thereby forming an image of the alignment mark 29 thereon. The light transmitted through the index plate 22 passes through a first relay lens 23 toward a beam splitter 24. The light transmitted through the beam splitter 24 is converged by an X-axis second relay lens 25X onto an imaging surface of an X-axis imaging device 26X comprising a two-dimensional CCD. On the other hand, the light reflected by the beam splitter 24 is converged by a Y-axis second relay lens 25Y onto an imaging surface of a Y-axis imaging device 26Y comprising a two-dimensional CCD. On each of the imaging planes of the imaging devices 26X and 26Y, an image of the alignment mark 29 and an image of an index mark on the index plate 22 are formed as being overlaid with each other. Both of imaging signals of the imaging devices 26X and 26Y are supplied to the coordinate measuring circuit 12a.

Figure 2:
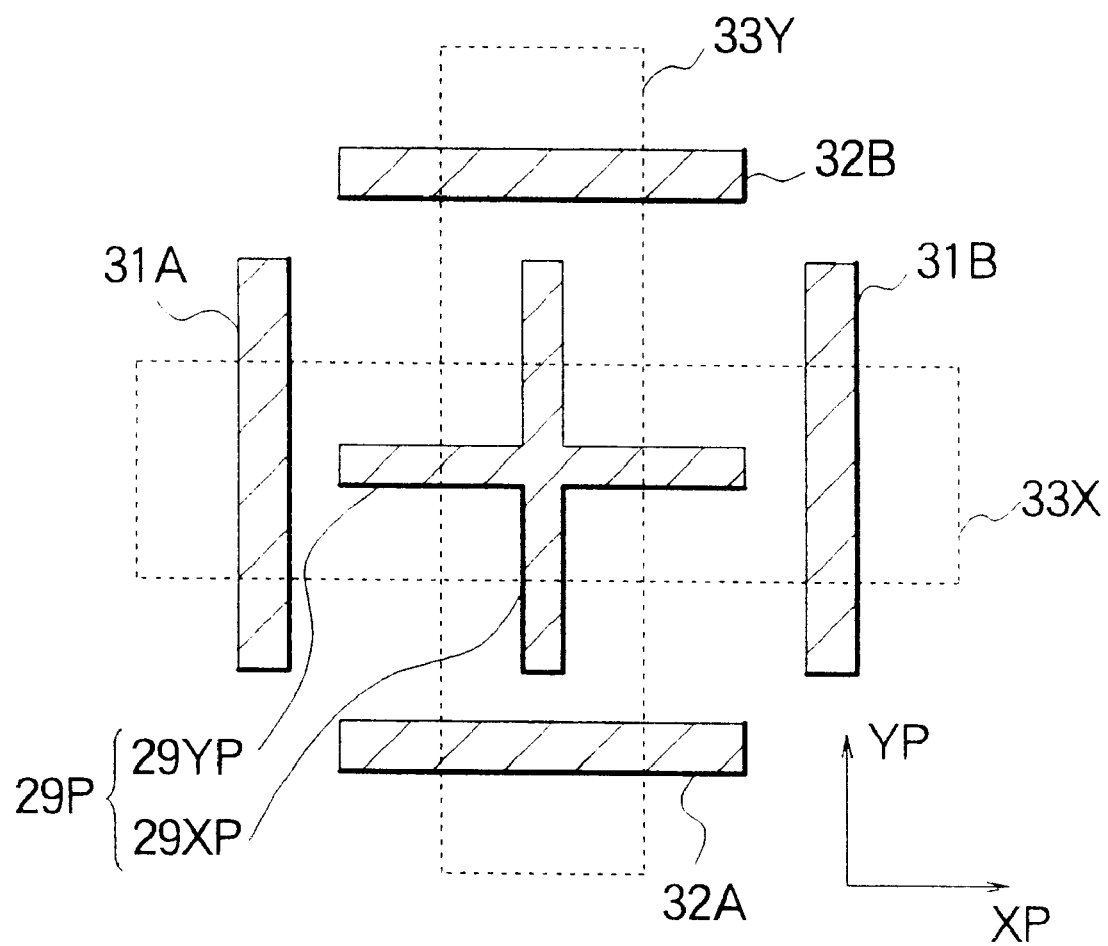
FIG. 2 is a schematic view showing a pattern formed on an index plate in FIG. 1.

FIG. 2 is a schematic view showing a pattern formed on the index plate 22. In FIG. 2, an image 29P of the cruciform alignment mark 29 is formed at the center portion, while XP and YP directions respectively perpendicular to orthogonal linear pattern images 29XP and 29YP of this image 29P are respectively made conjugate with X and Y directions in the stage coordinate system of the wafer stage 10 shown in FIG. 1. Two index marks 31A and 31B are formed so as to hold the alignment mark image 29P therebetween in XP direction, whereas two index marks 32A and 32B are formed so as to hold the alignment mark image 29P therebetween in YP direction.

In this case, an image within a detection area 33X encompassing the index marks 31A and 31B and the linear pattern image 29XP in XP direction is captured by the X-axis imaging device 26X, whereas an image within a detection area 33Y encompassing the index marks 32A and 32B and the linear pattern image 29YP in YP direction is captured by the Y-axis imaging device 26Y. Further, scanning directions for reading out photoelectrically-converted signals from pixels of the imaging devices 26X and 26Y are set to XP and YP directions, respectively. By processing the imaging signals of the imaging devices 26X and 26Y, amounts of positional deviation of the alignment mark image 29P with respect to the index marks 31A and 31B and the index marks 32A and 32B in XP and YP directions can be determined, respectively.

Accordingly, in FIG. 1, from the positional relationship between the image of the alignment mark 29 on the wafer 8 and the index mark on the index plate 22 as well as the result of measurement by the laser interferometer 12, the coordinate measuring circuit 12a determines coordinates of the alignment mark 29 on the stage coordinate system (X, Y) and then supplies thus measured coordinate value to the main control system 6.

In the following, the operation for aligning each shot area on the wafer 8 with a pattern image of the reticle 2 so as to effect exposure of each shot area will be explained.

Figure 3A:
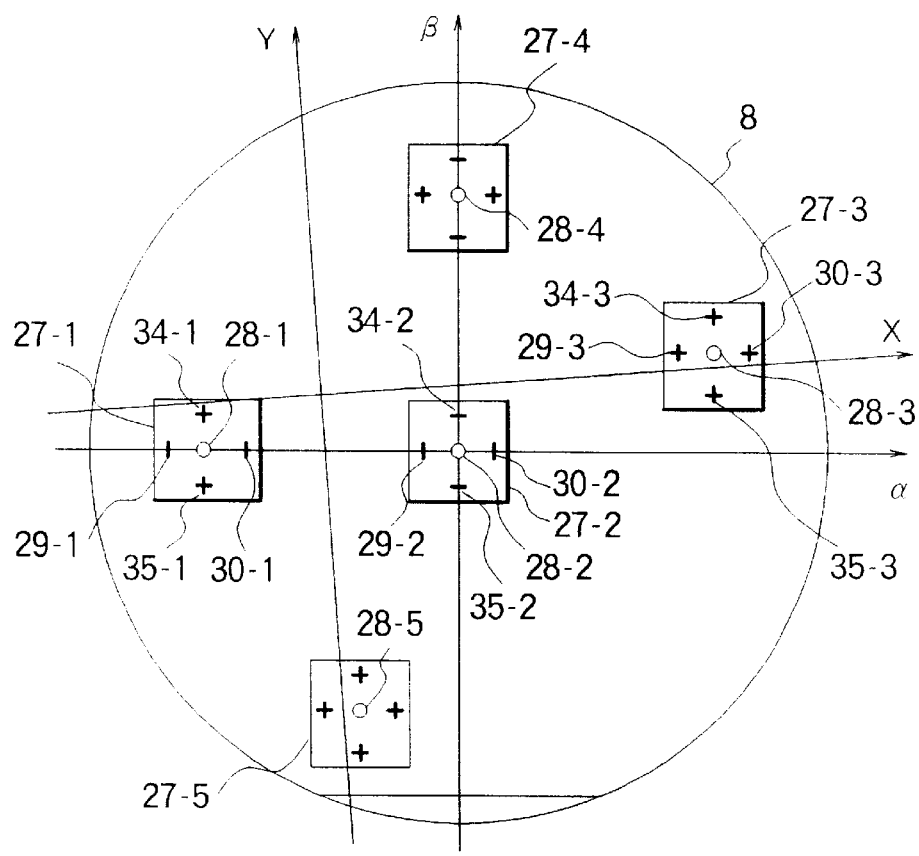
FIG. 3A is a schematic plan view showing a wafer used in the exposure apparatus according to Embodiment 1 of the present invention.

FIG. 3A is a schematic plan view showing the wafer 8 used in the exposure apparatus in accordance with the present invention. In FIG. 3A, a plurality of shot areas 27-n (n=0, 1, 2, . . . ) are arranged in a matrix along an orthogonal coordinate system ($\alpha$, $\beta$) on the wafer 8. A chip pattern has been formed on each shot area 27-n by exposure, development, and the like in the previous step. Here, FIG. 3A typically shows, of a plurality of shot areas, only five shot areas 27-1 to 27-5.

In each shot area 27-n, a reference position is determined. For example, it is assumed that, when the reference position coincides with a reference point 28-n at the center of each shot area 27-n, the designed coordinate value of this reference point 28-n in the coordinate system ($\alpha$, $\beta$) on the wafer 8 is expressed by ($C_{Xn}$, $C_{Yn}$). Also, in each shot area 27-n, four pieces of positioning alignment marks 29-n, 30-n, 34-n, and 35-n are concomitantly disposed. Here, as shown in FIG. 3A, when a coordinate system (x, y) on the shot area is set for each shot area 27-n in parallel to the coordinate system ($\alpha$, $\beta$) on the wafer 8 shown in FIG. 3A, the designed coordinate values of the alignment marks 29-n, 30-n, 34-n, and 35-n on their coordinate systems (x, y) are respectively expressed by ($S_{1Xn}$, $S_{1Yn}$), ($S_{2Xn}$, $S_{2Yn}$), ($S_{3Xn}$, $S_{3Yn}$), and ($S_{4Xn}$, $S_{4Yn}$).

Referring to FIG. 3A again, the wafer 8 is mounted on the wafer stage 10 shown in FIG. 1, and exposure is performed in a step-and-repeat method as projection images of the reticle are successively overlaid with a plurality of shot areas on which a chip pattern has already been formed. Here, the corresponding relationship between the stage coordinate (X, Y) defining the position of movement of the wafer stage 10 and the coordinate system ($\alpha$, $\beta$) of the wafer is not always the same as that in the previous step. Accordingly, when coordinates on the stage coordinate system (X, Y) are determined from the designed coordinate value ($C_{Xn}$, $C_{Yn}$) of the reference point 28-n in each shot area 27-n with respect to the coordinate system ($\alpha$, $\beta$), and the wafer is moved on the basis of thus determined coordinates, each shot area 27-n may not be precisely positioned.

Therefore, in this embodiment, as in the case of the conventional example, it is assumed that errors in positioning occur due to the following four factors:

1) Rotation of wafer: It is represented by residual rotational error $\Theta$ of the wafer coordinate system ($\alpha$, $\beta$) with respect to the stage coordinate system (X, Y).

2) orthogonality of stage coordinate system (X, Y): It is generated when the feeds of the wafer stage 10 in X-axis and Y-axis directions are not accurately orthogonal to each other, and is expressed by orthogonality error W.

3) Linear expansion or contraction (wafer scaling) in $\alpha$ and $\beta$ directions in the wafer coordinate system ($\alpha$, $\beta$): It is generated when the wafer 8 is expanded or contracted as a whole due to a processing step or the like. The amounts of expansion or contraction in $\alpha$ and $\beta$ directions are respectively expressed by wafer scaling values Rx and Ry. Here, the wafer scaling Rx in $\alpha$ direction is expressed by the ratio of the actually measured value of distance between two points in $\alpha$ direction on the wafer 8 to its designed value;

whereas the wafer scaling Ry in β direction is expressed by the ratio of the actually measured value of distance between two points in β direction on the wafer 8 to its designed value.

4) Offset of the coordinate system (α, β) with respect to the stage coordinate system (X, Y): It is generated when the wafer 8 as a whole shifts with respect to the wafer stage 10 by a minute amount, and is expressed by offset amounts $O_x$ and $O_y$.

When the foregoing error factors 1) to 4) are added to a shot area having a reference point with a designed coordinate value of ($C_{Xn}$, $C_{Yn}$), coordinate value ($C'_{Xn}$, $C'_{Yn}$) on the stage coordinate system (X, Y) to be positioned upon actual exposure is represented by the following expression (4):

$$\begin{bmatrix} C'_{Xn} \\ C'_{Yn} \end{bmatrix} = \begin{bmatrix} Rx & 0 \\ 0 & Ry \end{bmatrix} \begin{bmatrix} \cos\Theta & -\sin\Theta \\ \sin\Theta & \cos\Theta \end{bmatrix} \begin{bmatrix} 1 & -\tan W \\ 0 & 1 \end{bmatrix} \begin{bmatrix} C_{Xn} \\ C_{Yn} \end{bmatrix} + \begin{bmatrix} O_X \\ O_Y \end{bmatrix} \quad (4)$$

Here, when linear approximation is effected assuming that the orthogonality error W and the residual rotational error Θ are of minute quantities, expression (4) becomes:

$$\begin{bmatrix} C'_{Xn} \\ C'_{Yn} \end{bmatrix} = \begin{bmatrix} Rx & -Rx \cdot (W+\Theta) \\ Ry \cdot \Theta & Ry \end{bmatrix} \begin{bmatrix} C_{Xn} \\ C_{Yn} \end{bmatrix} + \begin{bmatrix} O_X \\ O_Y \end{bmatrix} \quad (5)$$

In the foregoing, explanation has been made how to accurately position the reference position (reference point of the center of each shot area in this embodiment) on each shot area 27-n. Nevertheless, even when the reference point of each shot area is accurately positioned, the chip pattern within each shot area as a whole and the projection image of the reticle do not always overlay with each other accurately throughout their corners.

In the following, overlay error within each shot area will be explained. As previously explained, in FIG. 3B, the alignment marks 29-n, 30-n, 34-n, and 35-n are formed at positions whose designed coordinate values are respectively ($S_{1Xn}$, $S_{1Yn}$) to ($S_{4Xn}$, $S_{4Yn}$) on the coordinate system (x, y) on the arbitrary shot area 27-n. In this embodiment, it is assumed that overlay error within each shot area is generated due to the following factors:

5) Rotation of chip pattern (chip rotation): It is generated, for example, when the reticle 2 is rotated with respect to the stage coordinate system (X, Y) or yawing is mixed into movement of the wafer stage 10 in the case where the wafer 8 is exposed to a projection image of the reticle 2. It is expressed by rotational error θ with respect to the coordinate system (x, y) of the shot area.

6) Orthogonality error of chip: It is an error in orthogonality of a chip pattern generated, for example, by strain of the pattern itself on the reticle 2, distortion of the projection optical system 7, or the like when the wafer 8 is exposed to a projection image of the reticle 2. It is expressed by angular error w.

7) Linear expansion or contraction of chip (chip scaling): It is generated due to an error in projection magnification at the time when the wafer 8 is exposed to a projection image of the reticle 2 or due to the fact that the wafer 8 as a whole or partly expands or contracts. Here, linear expansions or contractions in two directions are represented by x-direction chip scaling rx which is a ratio of the actually measured value of distance between two points in x direction in the coordinate system (x, y) of the shot area to its designed value and y-direction chip scaling ry which is a ratio of the actually measured value of distance between two points in y direction of the shot area to its designed value.

Figure 4A:
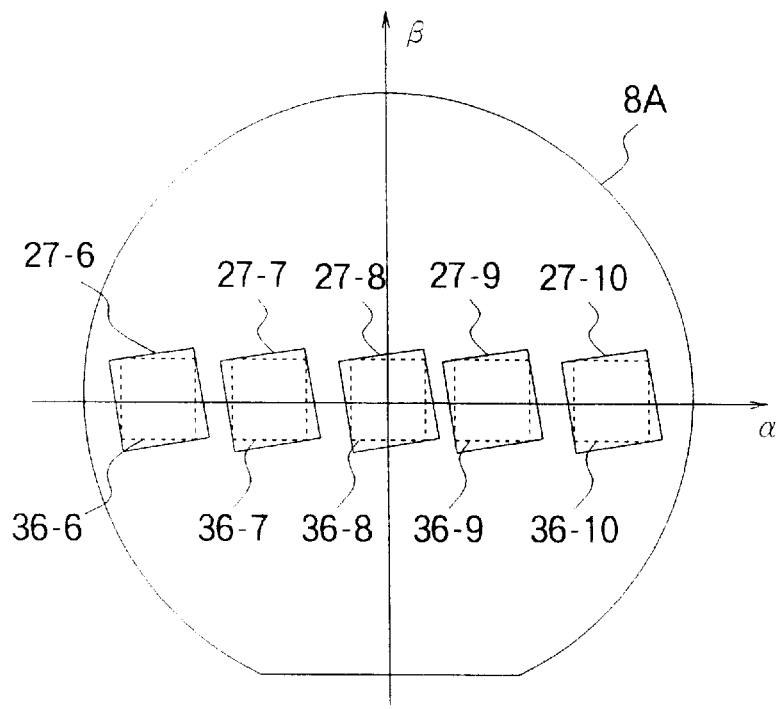
FIG. 4A is a plan view showing an example of a wafer including rotational error of a chip pattern and chip magnification error.

For example, FIG. 4A shows a wafer 8A in which rotational error and magnification error are generated in the chip pattern of each shot area 27-n formed by the previous step. In FIG. 4A, examples of shot areas free of rotational error and magnification error are indicated by shot areas 36-6 to 36-10 which are defined by broken lines. As compared therewith, shot areas 27-6 to 27-10 actually formed on the wafer 8A have different rotational angles and magnifications. Their differences can be divided into chip rotation error in which the shot area 27-n is tilted with respect to the ideal shot area 36-n as shown in FIG. 4B and chip scaling error in which the magnification of the shot area 27-n is different from that of the ideal shot area 36-n as shown in FIG. 4C.

Figure 4B:
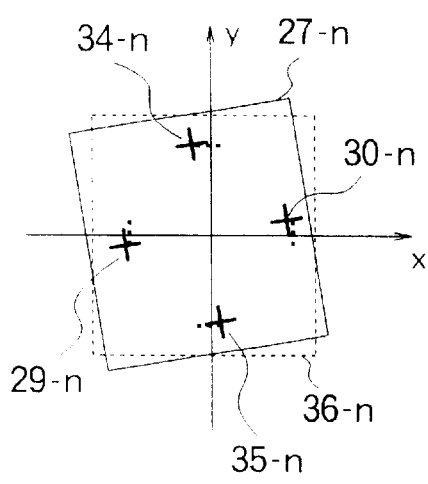
FIG. 4B is an explanatory view for chip rotation error.
Figure 4C:
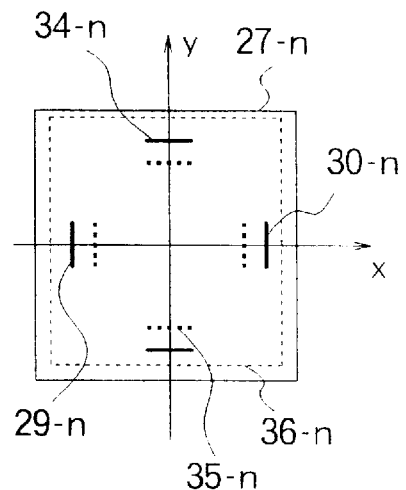
FIG. 4C is an explanatory view for chip magnification error.

Here, the examples of FIGS. 4A to 4C indicate a case where there is no orthogonality error of chip pattern, while the x-direction chip scaling rx and the y-direction ship scaling ry equal to each other.

When the foregoing error factors 5) to 7) are added to the alignment marks 29-n, 30-n, 34-n, and 35-n whose designed coordinate values on the shot area 27-n are expressed by ($S_{NXn}$, $S_{NYn}$) wherein N=1 to 4, coordinate value ($S'_{NXn}$, $S'_{NYn}$) of the shot area on the coordinate system (x, y) to be actually positioned is represented by the following expression (6):

$$\begin{bmatrix} S'_{NXn} \\ S'_{NYn} \end{bmatrix} = \begin{bmatrix} rx & 0 \\ 0 & ry \end{bmatrix} \begin{bmatrix} \cos\theta & -\sin\theta \\ \sin\theta & \cos\theta \end{bmatrix} \begin{bmatrix} 1 & -\tan W \\ 0 & 1 \end{bmatrix} \begin{bmatrix} S_{NXn} \\ S_{NYn} \end{bmatrix} \quad (6)$$

Here, when linear approximation is effected assuming that the orthogonality error w and the residual rotational error θ are of minute quantities, expression (6) becomes:

$$\begin{bmatrix} S'_{NXn} \\ S'_{NYn} \end{bmatrix} = \begin{bmatrix} rx & -rx \cdot (W+\theta) \\ ry \cdot \theta & ry \end{bmatrix} \begin{bmatrix} S_{NXn} \\ S_{NYn} \end{bmatrix} \quad (7)$$

Figure 3B:
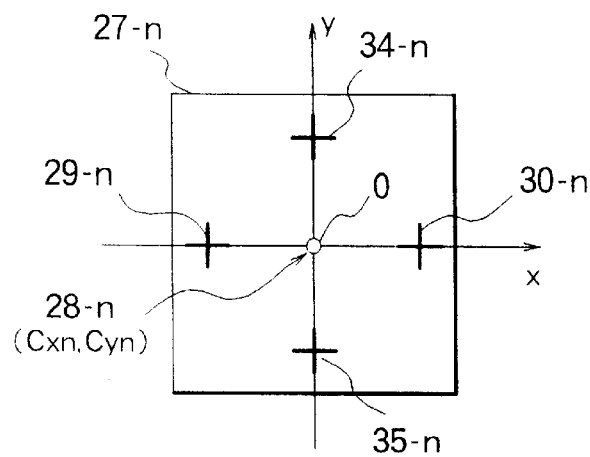
FIG. 3B is an enlarged view of a shot area shown in FIG. 3A.

Here, in FIG. 3B, since the arrangement coordinate value of the reference point 28-n of the arbitrary shot area 27-n is ($C_{Xn}$, $C_{Yn}$) on the stage coordinate system (X, Y), designed coordinate value ($D_{NXn}$, $D_{NYn}$) of an arbitrary alignment mark (29-n or 30-n) on the arbitrary shot area on the stage coordinate system (X, Y) is represented by the following expression (8). Here, as mentioned above, the alignment marks 29-n to 35-n are distinguished from each other according to values of N (1 to 4).

$$\begin{bmatrix} D_{NXn} \\ D_{NYn} \end{bmatrix} = \begin{bmatrix} C_{Xn} \\ C_{Yn} \end{bmatrix} + \begin{bmatrix} S_{NXn} \\ S_{NYn} \end{bmatrix} \quad (8)$$

The above-mentioned three kinds of errors 5) to 7) are generated when a chip pattern is burned onto a layer onto which the alignment marks for each shot area on the wafer 8 have already been burned. Actually, since they are further influenced by the above-mentioned errors 2) and 3), coordinate values ($F_{NXn}$, $F_{NYn}$), wherein N=1 to 4, of ideal positions of the alignment marks 29-n, 30-n, 34-n, and 35-n on the stage coordinate system (X, Y) are represented in view of expressions (5) and (7) as follows:

$$\begin{bmatrix} F_{NXn} \\ F_{NYn} \end{bmatrix} = \begin{bmatrix} C'_{Xn} \\ C'_{Yn} \end{bmatrix} + \begin{bmatrix} S'_{NXn} \\ S'_{NYn} \end{bmatrix} \quad (9)$$

-continued $$= \begin{bmatrix} Rx & -Rx \cdot (W+\Theta) \\ Ry \cdot \Theta & Ry \end{bmatrix} \begin{bmatrix} C_{Xn} \\ C_{Yn} \end{bmatrix} + \begin{bmatrix} O_X \\ O_Y \end{bmatrix} +$$

$$\begin{bmatrix} rx & -rx \cdot (w+\theta) \\ ry \cdot \theta & ry \end{bmatrix} \begin{bmatrix} S_{NXn} \\ S_{NYn} \end{bmatrix}$$

Next, in this embodiment, in order to facilitate adoption of least square method, α-direction scaling Rx and β-direction scaling Ry in expression (9) are represented as expression (10) respectively with new parameters Γx and Γy. Similarly, x-direction scaling rx and y-direction scaling ry in expression (9) are represented as expression (10) respectively with new parameters γx and γy.

$$Rx = 1 + \Gamma x, \; Ry = 1 + \Gamma y,$$

$$rx = 1 + \gamma x, \; ry = 1 + \gamma y \quad (10)$$

When these four new kinds of parameters Γx, Γy, γx, and γy indicative of changes in linear expansion or contraction are used so as to rewrite expression (9), it is approximated as follows:

$$\begin{bmatrix} F_{NXn} \\ F_{NYn} \end{bmatrix} = \begin{bmatrix} 1+\Gamma x & -(W+\Theta) \\ \Theta & 1+\Gamma y \end{bmatrix} \begin{bmatrix} C_{Xn} \\ C_{Yn} \end{bmatrix} + \quad (11)$$

$$\begin{bmatrix} 1+\gamma x & -(W+\theta) \\ \theta & 1+\gamma y \end{bmatrix} \begin{bmatrix} S_{NXn} \\ S_{NYn} \end{bmatrix} + \begin{bmatrix} O_X \\ O_Y \end{bmatrix}$$

Assuming that the two-dimensional vector is a matrix of two rows by one column in expression (11), this expression can be rewritten as the following coordinate transformation expression by use of transformation matrices:

$$F_{Nn} = AC_n + BS_{Nn} + O \quad (12)$$

Here, respective transformation matrices are defined as follows:

$$F_{Nn} = \begin{bmatrix} F_{NXn} \\ F_{NYn} \end{bmatrix}, \quad A = \begin{bmatrix} 1+\Gamma x & -(W+\Theta) \\ \Theta & 1+\Gamma y \end{bmatrix} \quad (13)$$

$$B = \begin{bmatrix} 1+\gamma x & -(W+\theta) \\ \theta & 1+\gamma y \end{bmatrix}, \quad O = \begin{bmatrix} O_X \\ O_Y \end{bmatrix}$$

$$C_n = \begin{bmatrix} C_{Xn} \\ C_{Yn} \end{bmatrix}, \quad S_{Nn} = \begin{bmatrix} S_{NXn} \\ S_{NYn} \end{bmatrix}$$

Namely, in expression (12), the matrix $F_{Nn}$ of two rows by one column is expressed by an addition of the matrix $AC_n$, the matrix $BS_{Nn}$, and the matrix O together. Ten pieces of error parameters Θ, W, Γx (=Rx−1), Γy, $O_X$, $O_Y$, θ, w, γx (=rx−1), and γy included in the transformation matrices A, B, and O in the coordinate transformation expression of expression (12) can be determined by least square method, for example.

Embodiment 2

In the following, with reference to the flow chart of FIG. 5, an example of alignment and exposure operations for exposure apparatus in accordance with the present invention on the basis of the coordinate transformation expression of expression (12) will be explained. In this embodiment, it is assumed that the exposure unit used for exposure of alignment marks on the wafer has been known.

Figure 5:
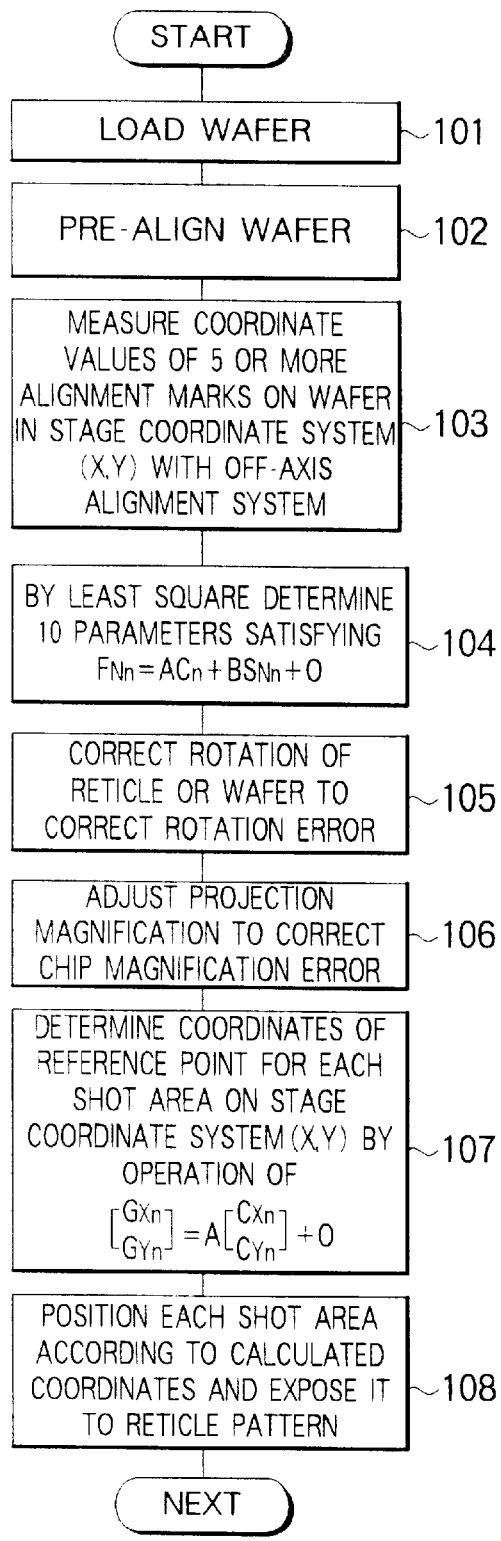
FIG. 5 is a flow chart showing alignment and exposure operations in which an alignment method for exposure apparatus according to Embodiment 2 of the present invention is adopted.

First, at step 101 of FIG. 5, the wafer 8 to be exposed is loaded on the wafer holder 9 shown in FIG. 1. In each shot area of the wafer 8, a chip pattern has already been formed in the previous step. Further, as shown in FIG. 3B, in each shot area 27-n on the wafer 8, four cruciform alignment marks 29-n, 30-n, 34-n, and 35-n have been formed by an exposure unit having a known lens distortion. Also, alignment of the reticle 2 has been completed, whereby the amounts of deviation of the reticle 2 in X and Y rotational directions with respect to the orthogonal coordinates defined by a non-depicted interferometer are nearly zero.

Here, due to the lens distortion inherent in the alignment mark exposure unit, assuming that the average projection magnification within the shot area is Me, projection magnification Ma at the alignment mark position is expressed by Ma=Me+M1; whereas, assuming that the average rotation of the projection image within the shot area is Re, rotation Ra of the projection image at the alignment mark position is expressed by Ra=Re+R1. The amounts of M1 and R1 can be determined from the lens distortion data stored in the distortion data storage device 6a.

Then, at step 102 of FIG. 5, the origin of the wafer 8 is set (pre-alignment). Thereafter, at step 103, the off-axis alignment system 15 shown in FIG. 1 is used so as to actually measure coordinate values ($FM_{NXn}$, $FM_{NYn}$) on the stage coordinate system (X, Y) of five or more alignment marks (29-n, 30-n, 34-n, or 35-n) on the wafer 8. Since one alignment mark comprises two components respectively in X and Y directions, values of 10 or more parameters can be determined when coordinate values of five or more alignment marks are actually measured. While the alignment marks to be actually measured should be selected from three or more shot areas 27-n, it is not always necessary for four alignment marks 29-n to 35-n to be selected from one shot area 27-n. Thus, one alignment mark (29-n, 30-n, 34-n, or 35-n) may be selected alone from one shot area 27-n.

Here, the designed arrangement coordinate value ($C_{Xn}$, $C_{Yn}$), on the coordinate system (α, β) on the wafer 8, of the reference point 28-n in each of the plurality of shot areas 27-n selected on the wafer 8 and the designed coordinate value (relative coordinate value) ($S_{NXn}$, $S_{NYn}$) of each measured alignment mark in the coordinate system (x, y) on each shot area 27-n have already been known. Accordingly, at step 104, into the right side of expression (10), the designed arrangement coordinate value ($C_{Xn}$, $C_{Yn}$) of the reference point for the shot area to which the measured alignment mark belongs and the designed relative coordinate value ($S_{NXn}$, $S_{NYn}$) concerning the reference point for the alignment mark are input, whereby calculated coordinate value ($F_{NXn}$, $F_{NYn}$) to be attained by the alignment mark on the stage coordinate system (X, Y) is determined.

Then, by least square method, 10 pieces of error parameters (Θ, W, Γx, Γy, $O_X$, $O_Y$, θ, w, γx, and γy) satisfying expression (12) are determined. Specifically, difference ($E_{NXn}$, $E_{NYn}$) between the actually measured coordinate value ($FM_{NXn}$, $FM_{NYn}$) and the calculated coordinate value ($F_{NXn}$, $F_{NYn}$) thereof is considered to be alignment error. Accordingly, $E_{NXn} = FM_{NXn} - F_{NXn}$ and $E_{NYn} = FM_{NYn} - F_{NYn}$ are established. When the sum of squares of five or more sets of alignment errors ($E_{NXn}$, $E_{NYn}$), namely, 10 or more values of alignment errors, is partially differentiated with the above-mentioned 10 parameters in succession; equations are established so as to minimize the resulting differentiated values; and then these 10 simultaneous equations are solved by least square method; the 10 error parameters can be determined.

Thereafter, at step 105, the reticle 2 is appropriately rotated by way of the reticle stage 3 in FIG. 1 or the wafer 8 is rotated so as to correct the rotational error θ of chip rotation in the transformation matrix B of expression 12, whereby the rotation of the chip pattern with respect to the stage coordinate system (X, Y) is corrected. It means that the reticle 2 or wafer 8 is rotated in response to the rotational error θ constituting an element in the transformation matrix B in expression (11). Since the determined rotational error θ includes the error R1 inherent in the alignment mark exposure unit as mentioned above, however, the amount of the reticle or wafer to be rotated at step 105 is (θ−R1).

Here, since offset error ($O_X$, $O_Y$) of the wafer 8 may change when the wafer 8 is rotated, it is necessary to re-determine the error parameters by conventional normal multipoint EGA operation after the coordinate value of the alignment mark is measured again. Therefore, when the wafer 8 is rotated by an angle (θ−R1), as in the conventional case where errors within the chip pattern are not taken into consideration, coordinate values of alignment marks in at least three shot areas on the wafer 8 in the stage coordinate system (X, Y) are measured again. From this result, values of six error parameters (Θ, W, Rx, Ry, $O_X$, and $O_Y$) are determined, and each shot area is positioned on the basis of arrangement coordinates computed from thus determined parameters and then is subjected to exposure.

Though the orthogonality error w of the chip cannot be corrected in its strict sense, the error can be minimized when the reticle is appropriately rotated. Here, the amount of rotation of reticle 2 or wafer 8 can be optimized such that the sum of respective absolute values of the residual rotational error Θ of the wafer, residual rotational error θ of the chip pattern, and orthogonality error w is minimized.

Next, at step 106, the projection magnification of the projection optical system 7 is adjusted by way of the imaging characteristic controller 14 in FIG. 1 so as to correct the chip scaling error in the transformation matrix B in expression (12). It means that the projection magnification of the projection optical system 7 is adjusted in response to the chip scaling values rx (=1+γx) and ry (=1+γy) constituting elements of the transformation matrix B indicated by expression (11). Here, the determined chip scaling values rx and ry respectively include errors rx1 and ry1 which are inherent in the alignment mark exposure unit as mentioned above. These errors rx1 and ry1 inherent in the exposure unit can be determined from the lens distortion data. Accordingly, at step 106, the projection magnification of the projection optical system 7 is adjusted in response to chip scaling values (rx−rx1) and (ry−ry1).

Thereafter, at step 107 shown in FIG. 5, while the transformation matrices A and O including elements composed of the error parameters determined at step 104 are used, the designed arrangement coordinate value ($C_{Xn}$, $C_{Yn}$) of the reference point 28-n in each shot area 27-n on the wafer 8 is input into the following expression (14) so as to determine calculated arrangement coordinate value ($G_{Xn}$, $G_{Yn}$) of the reference point 28-n on the stage coordinate system (X, Y). Here, when the wafer side 8 is rotated at step 105 in order to correct the rotation error as mentioned above, the calculated arrangement coordinate value ($G_{Xn}$, $G_{Yn}$) of each reference point 28-n on the stage coordinate system (X, Y) is determined on the basis of re-measured coordinates of the alignment marks.

$$\begin{bmatrix} G_{Xn} \\ G_{Yn} \end{bmatrix} = A \begin{bmatrix} C_{Xn} \\ C_{Yn} \end{bmatrix} + O \quad (14)$$

Thereafter, at step 108, on the basis of the calculated arrangement coordinate value ($G_{Xn}$, $G_{Yn}$) and a predetermined baseline amount, the reference point 28-n in each shot area 27-n on the wafer 8 is sequentially aligned with a predetermined position within the exposure field of the projection optical system 7 shown in FIG. 1, and then a pattern image of the reticle 2 is projected onto the shot area 27-n. After all the shot areas on the wafer 8 have completely been exposed to the pattern image, processing such as development of the wafer 8 is performed.

Here, this embodiment takes account of not only the transformation matrices A, O, and B indicated by expression (12) but also the lens distortion of the alignment mark exposure unit. Accordingly, without errors included in the alignment mark itself being taken in, the chip pattern in each shot area on the wafer and the projection image of the reticle pattern can be overlaid with each other more accurately.

Embodiment 3

In this embodiment, a case where the alignment mark exposure unit is unknown and errors included in the alignment mark cannot be found out beforehand will be explained.

In this case, from measured values of alignment marks within a shot area, error parameters Θ, W, Rx (=1+Γx), Ry (=1+Γy), $O_X$, $O_Y$, θ, w, rx (=1+γx), and ry (=1+γy) are determined. The difference between the ideal coordinate value of an alignment mark on the stage coordinate system (X, Y) calculated from its designed coordinate value by the coordinate transformation using these error parameters and the actual coordinate value thereof is defined as the non-linear component of the error. As this non-linear component of the error is compared with the non-linear component of the error assumed to be obtained when the alignment mark is exposed by each exposure unit having a known lens distortion, the alignment mark exposure unit is specified.

Thereafter, as in the case of the above-mentioned Embodiment 2, the reticle or wafer is rotated with the error inherent in thus specified alignment mark exposure unit being subtracted therefrom, so as to correct the rotational error θ of chip rotation, and the projection magnification of the projection optical system is adjusted in response to the chip scaling values rx and ry. Then, the transformation matrices A and O including elements composed of the above-mentioned error parameters are used to determine the calculated arrangement coordinate value of the reference point in each shot area on the stage coordinate system (X, Y). Thereafter, based on thus calculated arrangement coordinates and a predetermined baseline amount, the reference point in each shot area on the wafer is sequentially aligned with a predetermined position within the exposure field of the projection optical system, and then a pattern image of the reticle is projected onto the shot area. This step is repeated for all the shot areas.

Figure 6A:
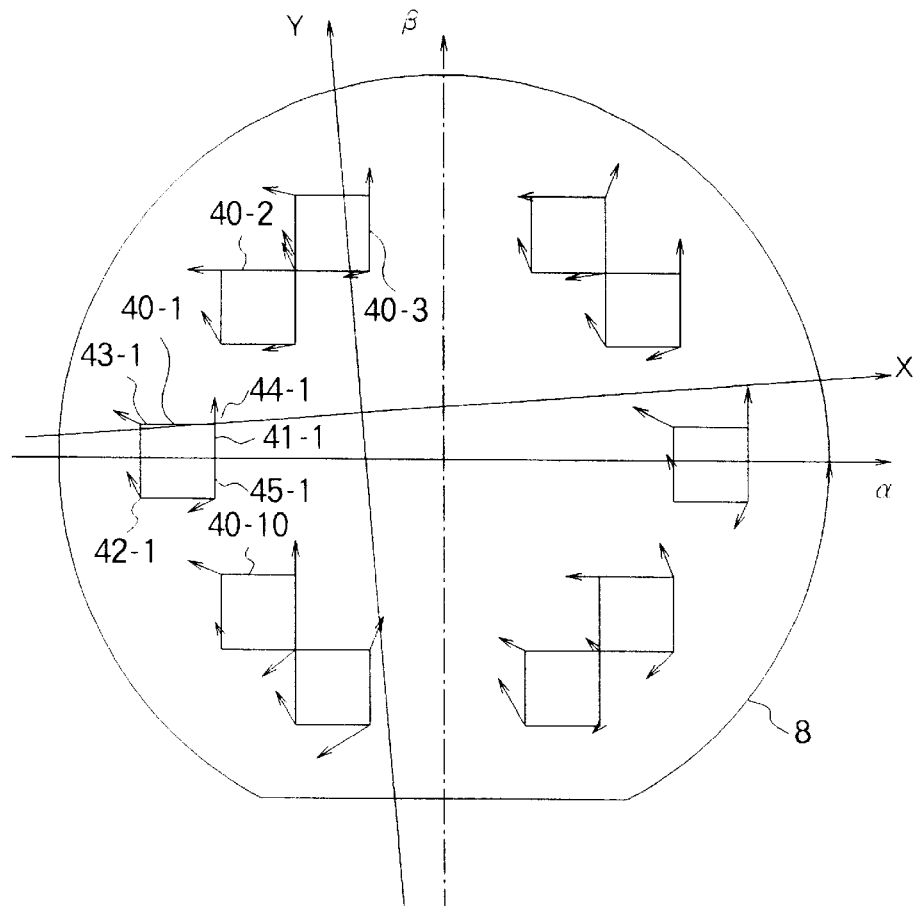
FIG. 6A is a plan view showing an example of arrangement of shot areas within a wafer according to Embodiment 3 of the present invention.

In the following, a method for specifying the alignment mark exposure unit will be explained in detail. Here, as shown in FIG. 6A, it is assumed that in-shot multipoint measurement is effected with respect to 10 pieces of shot areas 40-n (n=1 to 10) within the wafer 8 while four pieces of alignment marks 42-n, 43-n, 44-n, and 45-n (which are supposed to be respectively disposed at four corners of the shot area, here) within each shot area are used. It is assumed that not only the setting of the stage coordinate system (X, Y), coordinate system (α, β) on the wafer, and coordinate system (x, y) on the shot area but also notation of each system are similar to those in the above-mentioned Embodiment 2. Namely, a reference position is defined in each shot area 40-n, and assuming that the reference position is a reference point 41-n at the center of each shot area 40-n, the designed coordinate value of each reference point 41-n on the coordinate system (α, β) on the wafer 8 is expressed by ($C_{Xn}$, $C_{Yn}$). The coordinate system (x, y) on the shot area is set in parallel to the coordinate system (α, β) on the wafer. Designed coordinate values of four pieces of positioning alignment marks 42-n, 43-n, 44-n, and 45-n disposed in each shot area 40-n on the coordinate system (x, y) are expressed by ($S_{1xn}$, $S_{1Yn}$), ($S_{2xn}$, $S_{2Yn}$), ($S_{3xn}$, $S_{3Yn}$), and ($S_{4xn}$, $S_{4Yn}$), respectively.

In a method similar to that of the above-mentioned Embodiment 2, multipoint EGA operation is performed (expression (12)), 10 pieces of error parameters Θ, W, Γx (=Rx−1), Γy (=Ry−1), $O_X$, $O_Y$, θ, w, γx (=rx−1), and γy (=ry−1) included in the transformation matrices A, B, and O in the coordinate transformation expression indicated by expression (13) are determined, for example, by least square method. Then, amounts of deviation ($R_{NXn}$, $R_{NYn}$) between the coordinate value of the alignment mark ($F_{NXn}$, $F_{NYn}$) calculated by the coordinate transformation expression including thus determined error parameters and the actually measured coordinate value ($FM_{NXn}$, $FM_{NYn}$), i.e., $R_{NXn} = FM_{NXn} - F_{NXn}$ and $R_{NYn} = FM_{NYn} - F_{NYn}$, are determined for each of the alignment marks 42-n, 43-n, 44-n, and 45-n within 10 pieces of shot areas 40-n (n=1 to 10). In the expressions, shot areas 40-1 to 40-10 are distinguished from each other according to values of n (1 to 10), while the alignment marks 42-n, 43-n, 44-n, and 45-n are distinguished from each other according to values of N (1 to 4).

Thus determined amounts of deviation ($R_{NXn}$, $R_{NYn}$) are called "random error." For each of four positions in each shot area 40-n, 10 shots of random error within the wafer are determined. FIG. 6A schematically shows, in terms of vector, random errors ($R_{NXn}$, $R_{NYn}$) respectively generated at positions of four alignment marks 42-n, 43-n, 44-n, and 45-n disposed in each of the shot areas 40-1 to 40-n. When these random errors are averaged at the respective alignment mark positions, in-shot random error ($RE_{NX}$, $RE_{NY}$) is obtained. Namely, in this case, $RE_{NX} = \Sigma R_{NXn}/10$ and $RE_{NY} = \Sigma R_{NYn}/10$ (N=1 to 4).

Figure 6B:
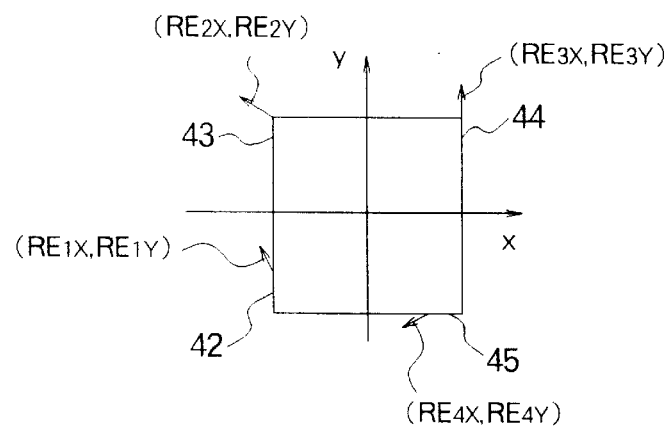
FIG. 6B is an explanatory view for random error within a shot.

FIG. 6B shows, in terms of vector, these in-shot random errors ($RE_{1X}$, $RE_{1Y}$), ($RE_{2X}$, $RE_{2Y}$), ($RE_{3X}$, $RE_{3Y}$), and ($RE_{4X}$, $RE_{4Y}$).

On the other hand, for all the exposure units, distortion data of their projection lenses have been determined beforehand and stored in the distortion data storage device 6a. Alternatively, these distortion data may be composed of distortion data concerning, for example, 17 points within the shot area and stored in an exposure apparatus which performs overlay burning. Also, distortion data for all the exposure units may be centrally controlled so as to be inquired on-line when necessary.

For the distortion data of the projection lens of each exposure unit, assuming that Θ=0, W=0, $\Gamma_x$=0, $\Gamma_y$=0, $O_X$=0, and $O_Y$=0, an operation identical to the multipoint EGA operation is effected around the shot center, so as to determine error parameters θ, w, γx (=rx−1), and γy (=ry−1) within the shot area. Then, the distortion value calculated at the alignment mark position from the coordinate transformation expression including these error parameters is compared with the actual distortion data so as to determine, as their difference, distortion random error ($DRE_{NXm}$, $DRE_{NYm}$) at each of the four points (N=1 to 4). Here, m is the number for identifying the exposure unit (m=1, 2, 3, . . . ).

Thereafter, the previously determined in-shot random error ($RE_{NX}$, $RE_{NY}$), wherein N=1 to 4, and the distortion random error ($DRE_{NXm}$, $DRE_{NYm}$) of the projection lens of each exposure unit, wherein N=1 to 4, are compared with each other so as to select the projection lens which generates a random error closest thereto. This comparison may be effected, for example, in the following method. First, with respect to vector $X_N$ (N=1 to 4) of the in-shot random error data ($RE_{NX}$, $RE_{NY}$), the vector of the distortion random error data ($DRE_{NXm}$, $DRE_{NYm}$) is expressed by $1_{Nm}$ (N=1 to 4). Assuming that the angle formed by the vectors $X_N$ and $1_{Nm}$ with respect to each other is $\theta_{Nm}$ (N=1 to 4), the condition under which the vectors $X_N$ and $1_{Nm}$ are close to each other is that $\theta_{Nm}$ is small while the difference between lengths of $X_N$ and $1_{Nm}$ is small. Therefore, $S_{Nm}=|X_N - 1_{Nm}|$ (N=1 to 4) is determined for each point. The sum thereof for all the points is:

$$\Sigma S_{Nm} = \Sigma |X_N - 1_{Nm}|$$

wherein N=1 to 4.

As this value is smaller, it indicates that the vector $X_N$ of the data ($RE_{NX}$, $RE_{NY}$) and the vector $1_{Nm}$ of the data ($DRE_{NXm}$, $DRE_{NYm}$) coincide with each other to a higher degree. Accordingly, for the distortion data of all the exposure units (m=1, 2, 3, . . . ) which are subjected to comparison, $\Sigma S_{Nm}$ is determined, and then the exposure unit yielding the smallest value thereof is found out.

According to the foregoing method, the alignment mark exposure unit is specified, and the distortion data ($DRE_{NXm}$, $DRE_{NYm}$) of the projection lens of this exposure unit (N=1 to 4) is selected. From the distortion data of thus specified alignment mark exposure unit, lens magnification error M1 and lens rotation R1 specific to this exposure unit at the alignment mark position can be computed.

Embodiment 4

Figure 7:
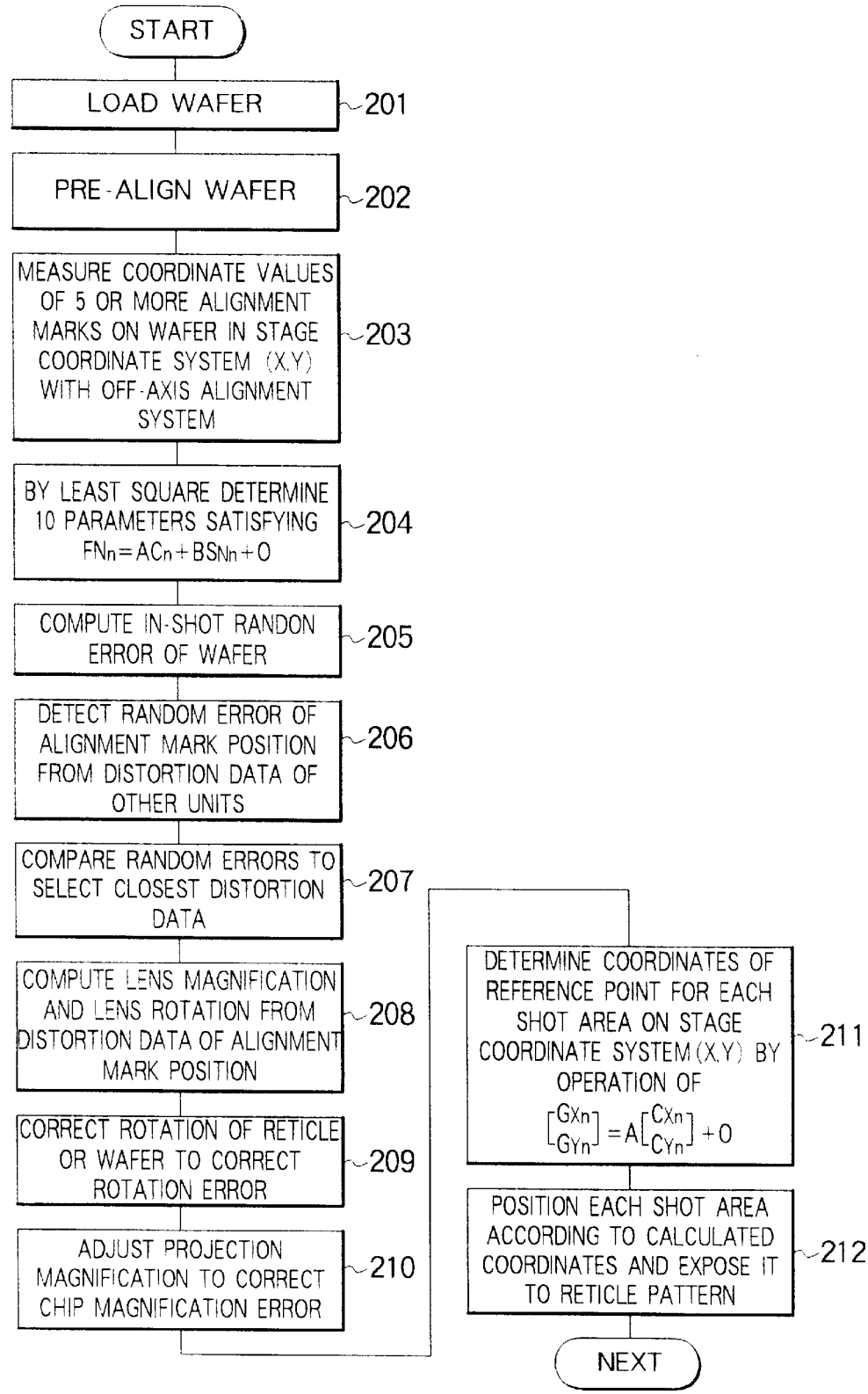
FIG. 7 is a flow chart showing alignment and exposure operations in which an alignment method for exposure apparatus according to Embodiment 4 of the present invention is adopted.

In the following, alignment and exposure operations for exposure apparatus in Embodiment 4 will be explained with reference to the flow chart of FIG. 7. First, at step 201, as in the case of the above-mentioned Embodiment 2, the wafer 8 to be exposed to light at this time is loaded on the wafer holder 9 shown in FIG. 1. In each shot area of the wafer 8, a chip pattern has already been formed in the previous step. Further, in each shot area 40-n on the wafer 8, four cruciform alignment marks 42-n, 43-n, 44-n, and 45-n have been formed by an exposure unit having an unknown lens distortion. Also, alignment of the reticle 2 has been completed, whereby the amounts of deviation of the reticle 2 in X and Y rotational directions with respect to the orthogonal coordinates defined by a non-depicted interferometer are nearly zero.

Then, at step 202, the origin of the wafer 8 is set (pre-alignment); and, at step 203, the off-axis alignment system 15 shown in FIG. 1 is used so as to actually measure coordinate values ($FM_{NXn}$, $FM_{NYn}$) on the stage coordinate system (X, Y) of five or more alignment marks (42-n, 43-n, 44-n, or 45-n) on the wafer 8. Since the designed coordinate value ($C_{Xn}$, $C_{Yn}$), on the coordinate system (α, β) on the wafer 8, of the reference point 41-n in each of a plurality of shot areas selected on the wafer 8 and the designed coordinate (relative coordinate) value ($S_{NXn}$, $S_{NYn}$) of the measured alignment mark in the coordinate system (x, y) on each shot area 40-n have already been known; at step 204, into the right side of expression (10), the designed arrangement coordinate value ($C_{Xn}$, $C_{Yn}$) of the reference point in the shot area to which the measured alignment mark belongs and the designed relative coordinate value ($S_{NXn}$, $S_{NYn}$) concerning the reference point for the alignment mark are input, whereby calculated coordinate value ($F_{NXn}$, $F_{NYn}$) to be attained by the alignment mark on the stage coordinate system (X, Y) is determined.

Then, by least square method, 10 pieces of error parameters (Θ, W, Γx, Γy, $O_X$, $O_Y$, θ, w, γx, and γy) satisfying expression (12) are determined. Specifically, difference ($E_{NXn}$, $E_{NYn}$) between the actually measured coordinate value ($FM_{NXn}$, $FM_{NYn}$) and the calculated coordinate value ($F_{NXn}$, $F_{NYn}$) thereof is considered to be alignment error. Accordingly, $E_{NXn}=FM_{NXn}-F_{NXn}$, and $E_{NYn}=F_{NYn}$. When the sum of squares of five or more sets of alignment errors ($E_{NXn}$, $E_{NYn}$), namely, 10 or more values of alignment errors, is partially differentiated with the above-mentioned 10 parameters in succession; equations are established so as to minimize the resulting differentiated values; and then these 10 simultaneous equations are solved by least square method; the 10 error parameters can be determined. The foregoing procedure is totally the same as that of Embodiment 2.

Then, at step 205, the random error ($R_{NXn}$, $R_{NYn}$), which is the amount of deviation between the coordinate value of the alignment mark calculated by the coordinate transform expression including thus determined error parameters and the actually measured coordinate value, is determined for each of all the shot areas and then averaged at each alignment mark position of the shot area, so as to compute the in-shot random error ($RE_{NX}$, $RE_{NY}$) shown in FIG. 6B (N=1 to 4).

At step 206, for each of all the exposure units, with respect to the known distortion data of the projection lens thereof, an operation identical to the multipoint EGA operation is effected around the shot center, so as to determine error parameters within the shot area. Then, the distortion value calculated at the alignment mark position from the coordinate transformation expression including these error parameters is compared with the actual distortion data so as to determine the distortion random error ($DRE_{NXm}$, $DRE_{NYm}$) at the alignment position.

At step 207, the determined in-shot random error ($RE_{NX}$, $RE_{NY}$) and the distortion random error ($DRE_{NXm}$, $DRE_{NYm}$) of the projection lens of each exposure unit are compared with each other so as to select the projection lens which generates a random error closest to the actual random error. Then, at step 208, the distortion data ($DRE_{NXm}$, $DRE_{NYm}$) of the projection lens of thus specified exposure unit is used to compute the lens magnification error M1 and lens rotation R1 specific to the exposure unit at the alignment mark position.

Thereafter, as in the case of the above-mentioned Embodiment 2, at step 209, the reticle or wafer is rotated by an amount (θ−R1) in which the rotational error θ in chip rotation determined by multipoint EGA operation is corrected by the lens rotation R1 inherent in the alignment exposure unit, so as to correct the rotation of chip pattern with respect to the stage coordinate system (X, Y). Further, at step 210, the projection magnification of the projection optical system is adjusted in response to chip scaling values (rx−rx1) and (ry−ry1) in which lens magnification errors rx1 and ry1 inherent in the alignment mark exposure unit are respectively subtracted from the chip scaling values rx and ry determined by multipoint EGA operation.

Thereafter, at step 211, while the transformation matrices A and O including elements composed of the error parameters determined at step 204 are used, the designed arrangement coordinate value ($C_{Xn}$, $C_{Yn}$) of the reference point 41-n in each shot area 40-n on the wafer 8 is input into expression (14) so as to determine calculated arrangement coordinate value ($G_{Xn}$, $G_{Yn}$) of the reference point 41-n on the stage coordinate system (X, Y). Subsequently, at step 212, on the basis of the calculated arrangement coordinate value ($G_{Xn}$, $G_{Yn}$) and a predetermined baseline amount, the reference point 41-n in each shot area 40-n on the wafer 8 is sequentially aligned with a predetermined position within the exposure field of the projection optical system, and then a pattern image of the reticle is projected onto the shot area 40-n. After all the shot areas on the wafer have completely been exposed to the pattern image, processing such as development of the wafer is performed.

This embodiment, as in the case of the above-mentioned Embodiment 2, takes account of not only the transformation matrices A, O, and B indicated by expression (12) but also the lens distortion of the alignment mark exposure unit. Accordingly, without errors included in the alignment mark itself being taken in, the chip pattern in each shot area on the wafer and the projection image of the reticle pattern can be overlaid with each other more accurately.

In each of the foregoing embodiments, it can be assumed that, in the wafers within the same lot, alignment marks are formed by the same exposure unit having the same distortion. Accordingly, it is unnecessary to determine random errors for all the wafers and compare them with other distortion data. Thus, the distortion data selected for the first wafer may also be applied to the second and later wafers. When multipoint EGA measurement is performed for all the shot areas in the first wafer, non-linear errors within the shot can be computed more accurately.

In the following, explanation will be provided for a correction method in which lens magnification and lens rotation of a second layer exposure apparatus are taken into account. As in the expressions mentioned above, shot magnification Me and shot rotation Re in which the lens magnification M1 and the lens rotation R1 of the first layer exposure apparatus are respectively subtracted from their original values can be represented by the following expressions:

$$Me=Ma-M1$$

$$Re=Ra-R1$$

When the second layer exposure apparatus is the same as that of the first layer exposure apparatus, it is controlled such that the target values for the shot magnification and shot rotation respectively become Me and Re.

It is assumed that the lens magnification and lens rotation determined from distortion of the second exposure apparatus at the alignment mark position are respectively M2 and R2. Then, lens magnification difference Md and lens rotation difference Rd between the first layer exposure apparatus and the second layer exposure apparatus at the alignment mark position are respectively represented by the following expressions:

$$Md=M2-M1$$

$$Rd=R2-R1$$

Since the lens magnification difference Md and lens rotation difference Rd exist when the shot magnification and shot rotation of the second layer are to be corrected, these differences must be subtracted from the shot magnification and shot rotation, respectively. Accordingly, when the target values for shot magnification and shot rotation are respectively referred to as Mt and Rt, they can be represented by the following expressions:

$$Mt=Me-Md=Ma-M1-(M2-M1)=Ma-M2$$

$$Rt=Re-Rd=Ra-R1-(R2-R1)=Ra-R2$$

When such correction is to be effected, alignment is desirably performed in a state where alignment mark and vernier mark positions are nearly the same or where the vernier mark itself is used.

The present invention can be applied not only to step-and-repeat type exposure apparatuses such as demagnification projection type steppers and real-size projection type steppers but also to so-called step-and-scan type exposure apparatuses.

Here, when the above-mentioned alignment method is applied to a scanning type exposure apparatus such as a step-and-scan type exposure apparatus, the wafer is aligned with a position in which a predetermined offset (value univocally determined according to pattern size, approaching sections for the reticle and wafer, and the like) is added to the coordinate position determined by the foregoing embodiments, and then scanning exposure is effected.

Thus, without being restricted to the foregoing embodiment the present invention can have a variety of configurations as long as they do not deviate from the gist of the present invention.

In accordance with the present invention, since the exposure apparatus can be adjusted while errors included in the alignment mark itself are excluded therefrom, the chip pattern in each shot area on the wafer and the projection image of the reticle pattern can be overlaid with each other more accurately.

Also, the random error (non-linear error) computed by in-shot multipoint EGA operation is utilized to specify the exposure unit used for forming the alignment mark. Accordingly, even when the alignment mark exposure unit is unknown, the unit can be estimated, thereby eliminating distortion management for each wafer.

Embodiment 5

In the following, the exposure apparatus in accordance with Embodiment 5 of the present invention will be explained with reference to the drawings. In this embodiment, the present invention is applied to a case where a plurality of stepper type projection exposure apparatuses are used to effect exposure in a mix-and-match method.

Figure 8:
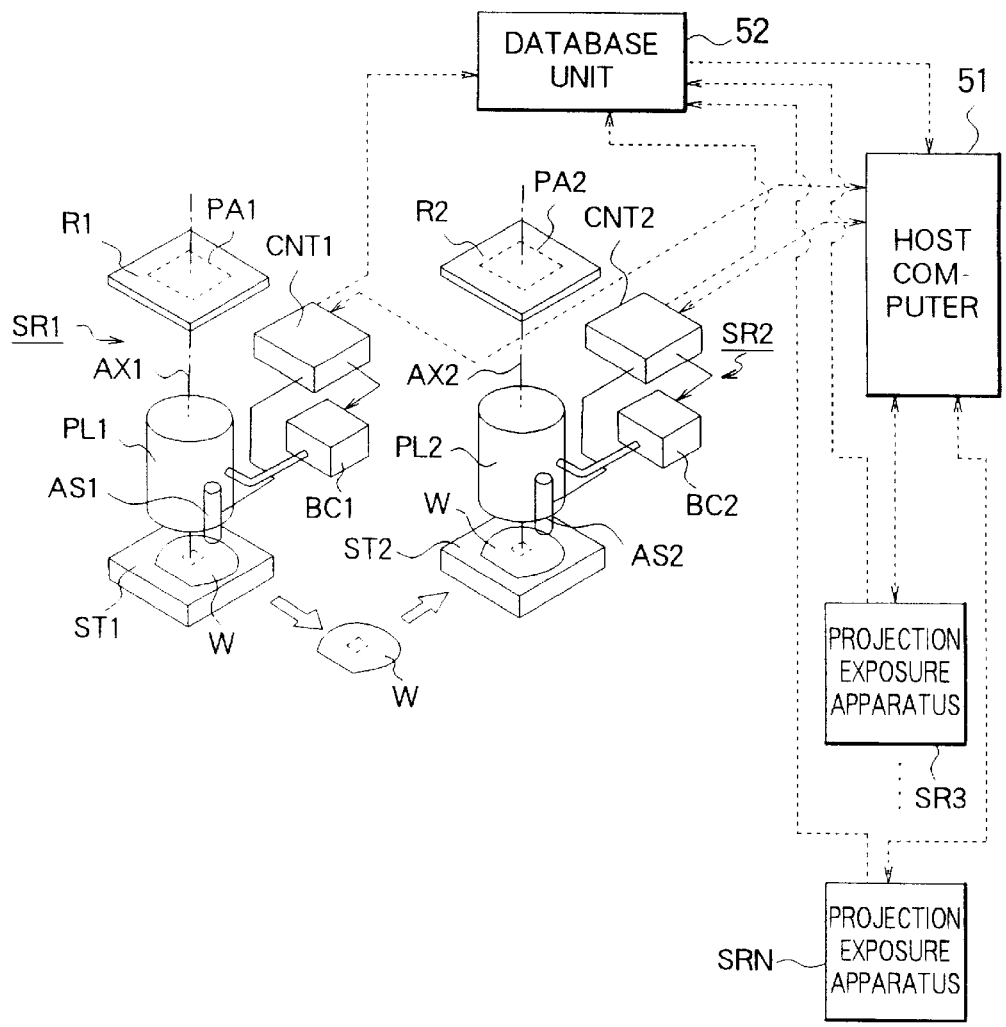
FIG. 8 is a schematic configurational view showing an exposure apparatus in accordance with Embodiment 5 of the present invention.

FIG. 8 is a schematic configurational view showing the exposure apparatus according to Embodiment 5. In FIG. 8, N pieces (N being an integer of 2 or higher) of stepper type projection exposure apparatuses SR1, SR2, . . . , SRN are disposed in a predetermined arrangement, while their operations are controlled on-line in a supervising manner by a host computer 51. Also, to the host computer 51, a database unit 52 comprising a magnetic disk device or the like is connected such that, as will be explained later, each of distortion data measured by the projection exposure apparatuses SR1 to SRN is supplied on-line to the database unit 52 so as to be updated and registered. Accordingly, within the database unit 52, the respective newest distortion data for the projection exposure apparatuses SR1 to SRN are always stored. Each of the projection exposure apparatuses SR1 to SRN can take in the distortion data within the database unit 52 by way of the host computer 51.

In the following, the configuration of each projection apparatus will be explained. First, in the first projection exposure apparatus SR1, a pattern area PA1 of the lower surface of a reticle R1 is illuminated with exposure light from a non-depicted illumination optical system and then projected onto each shot area of a wafer W on a wafer stage ST1 while being demagnified to a magnification of $\beta$ ($\beta$ being 1/5, for example) by a projection optical system PL1. The wafer stage ST1 positions the wafer within a plane perpendicular to an optical axis AX1 of the projection optical system PL1, in a direction in parallel to the optical axis AX1, and the like. The two-dimensional coordinates of the wafer stage ST1 measured by a non-depicted movable mirror fixed onto the wafer stage ST1 and an external laser interferometer are supplied to a controller CNT1, which drives, based on thus supplied coordinates, the wafer stage ST1 in two-dimensional directions in a stepping manner, thereby positioning the wafer W. The controller CNT1 also has functions of transmitting and receiving a variety of data and commands to and from the host computer 51 and transmitting a variety of data to the database unit 52.

Also, connected to the projection optical system PL1 of the projection exposure apparatus SR1 is a pressure adjuster BC1 as a magnification correcting means, to which the controller CNT1 supplies a correction value for magnification of the projection optical system PL1. In response to this correction value, the pressure adjuster BC1 regulates the pressure of gas within a predetermined gas chamber defined by predetermined lenses constituting the projection optical system PL1 and their lens barrel, so as to change magnification $\beta$ of the projection optical system PL1 by the correction value. Here, instead of adjusting the pressure of air within a predetermined gas chamber in this manner, for example, a predetermined lens within the projection optical system PL1 may be driven in the optical axis direction or the angle of inclination of a predetermined lens with respect to a plane perpendicular to the optical axis may be regulated so as to adjust the magnification of the projection optical system PL1.

Further, on a side of the projection optical system PL1 of the projection exposure apparatus SR1 in this embodiment, an alignment sensor AS1 of off-axis type and imaging type, for example, is disposed. When the second or later layer on the wafer is to be exposed to light, the coordinates of wafer marks detected by the alignment sensor AS1 are supplied to the controller CNT1, which then determines, from thus supplied coordinates, the arrangement coordinates of their corresponding shot area. Subsequently, the controller CNT1 uses the above-mentioned EGA type alignment so as to statistically process a predetermined number of shot areas (sample shots), thereby computing the arrangement coordinates of all the shot areas on the wafer. Thereafter, as the wafer stage ST1 is driven on the basis of thus computed arrangement coordinates, the respective shot areas on the wafer are sequentially aligned with an exposure position (projection image of the pattern area PA1) so as to be exposed to light.

Also, for example, a plurality of two-dimensional wafer marks may be formed in each shot area on the wafer, and their coordinates may be detected by the alignment sensor AS1 according to in-shot multipoint measurement method. As the result of this detection is processed, the magnification error, rotational angle, or the like of the pattern formed in the corresponding shot area can be detected.

Each of the other projection exposure apparatuses SR2 to SRN is configured similarly to the projection exposure apparatus SR1. For example, the second projection exposure apparatus SR2 is configured such that a pattern within a pattern area PA2 of a reticle R2 can be demagnified to a magnification of β and projected onto a wafer on a wafer stage ST2 by way of a projection optical system PL2, while the magnification of the projection optical system PL2 can be controlled by a controller CNT2 by way of a pressure adjuster BC2. Also, coordinates of wafer marks detected by an alignment sensor AS2 are supplied to the controller CNT2.

In the following, an example of operations in which each shot area on the wafer W is exposed to light in a mix-and-match method will be explained with reference to FIGS. 9A to 11B. Specifically, explanation is provided for a case where, after the first layer of each shot area on the wafer W is exposed to light by use of the first projection exposure apparatus SR1 and then subjected to processing steps such as etching and film-forming steps, the second layer of each shot area is exposed to light by use of the second projection exposure apparatus SR2.

Figure 9A:
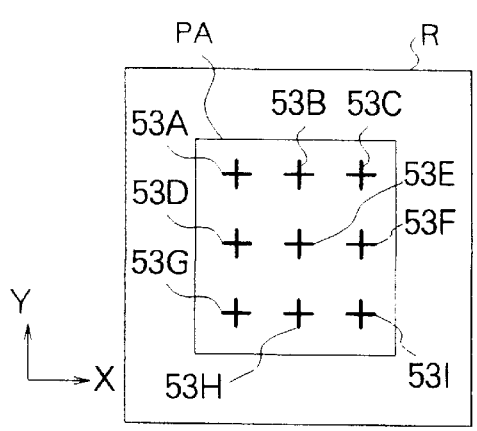
FIG. 9A is a plan view showing a pattern arrangement of a test reticle.

First, prior to exposure of the wafer W, a test reticle R shown in FIG. 9A is used to measure distortion characteristics of projection optical systems of the projection exposure apparatuses SR1 to SRN. As shown in FIG. 9A, in the pattern area PA of the test reticle R, nine pieces of cruciform imaging characteristic measuring marks 53A, 53B, . . . , 53H, and 53I are formed in orthogonal two directions (referred to as X and Y directions) with respective predetermined pitches. For example, in the first projection exposure apparatus SR1, the test reticle R is loaded in place of the reticle R1, an unexposed wafer coated with photoresist is loaded onto the wafer stage ST1, the magnification of the projection optical system PL1 from the reticle to the wafer is set to β (e.g., 1/5), and then the pattern image of the test reticle R is projected onto one shot area on the wafer. Here, the magnification in the case where distortion or the like exists is defined, for example, by a magnification at an image height which is 70% of the maximum image height. Then, after development, this wafer is loaded onto the wafer stage ST1, positions of formed images of the imaging characteristic measuring marks 53A to 53I are measured by the alignment sensor AS1, and the result of measurement is supplied to the controller CNT1.

Figure 10A:
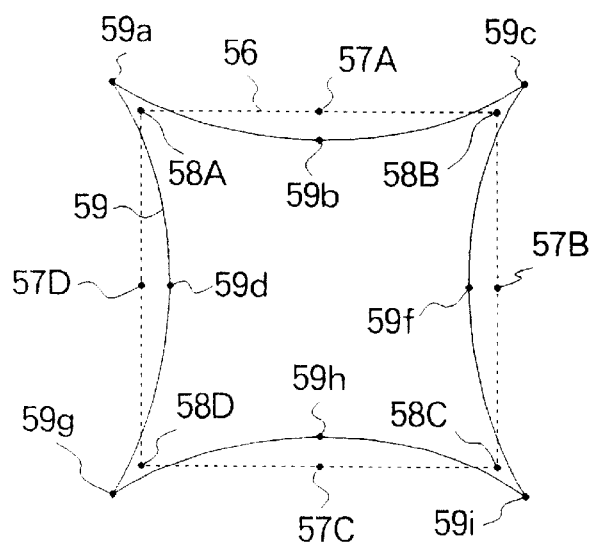
FIGS. 10A to 10C are explanatory views showing distortion data and distortion matching data in the exposure apparatus shown in FIG. 8.

FIG. 10A shows the result of measurement of the first projection exposure apparatus SR1. Here, a reference pattern 56 in FIG. 10A is defined as a pattern which is obtained when a square original pattern formed as the imaging characteristic measuring marks 53A to 53I (except for the mark 53E at the center) are connected together with lines is projected onto the wafer by way of a projection optical system which is free of distortion and linear magnification error and has a magnification exactly at β. Also, on the respective sides of the reference pattern 56 in FIG. 10A, points conjugate with the imaging characteristic measuring marks 53B, 53F, 53H, and 53D are defined as measurement points 57A to 57D; whereas apexes of the reference pattern 56 conjugate with the imaging characteristic measuring marks 53A, 53C, 53I, and 53G are respectively defined as measurement points 58A to 58D.

Assuming that projection images of the imaging characteristic measuring marks 53A to 53D and 53F to 53I in FIG. 9A formed by the first projection exposure apparatus SR1 are respectively imaging points 59a to 59d and 59f to 59i in FIG. 10A, amounts of two-dimentional deviation from the measurement points 57A to 57D and 58A to 58D to their corresponding imaging points are determined by the controller CNT1. These amounts of positional deviation are stored into the database unit 52 of FIG. 8 as the distortion data of the first projection exposure apparatus SR1. Here, a projection pattern 59 obtained as the adjacent imaging points 59a, 59b, . . . , 59g, and 59d are connected together has a pin-cushion form, thereby indicating that the projection optical system PL1 of the first projection exposure apparatus SR1 has a pin-cushion type distortion.

Figure 10B:
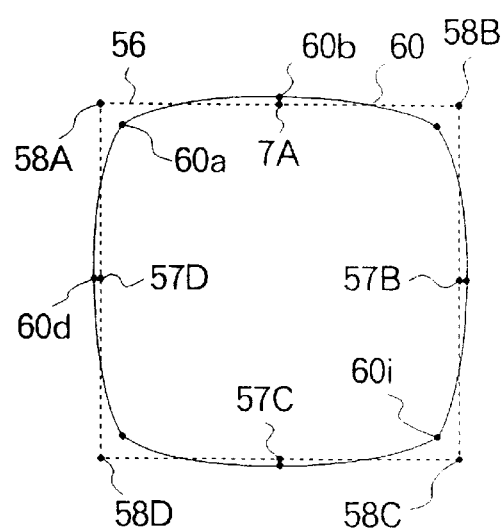

Similarly, FIG. 10B shows the result of measurement where the pattern of the test reticle R is projected by the second projection exposure apparatus SR2 with a magnification of β. In FIG. 10B, assuming that projection images of the imaging characteristic measuring marks 53A, 53B, . . . , and 53I in FIG. 9A formed by the second projection exposure apparatus SR2 are respectively imaging points 60a, 60b, . . . , and 60i, amounts of two-dimentional deviation from the measurement points 57A to 57D and 58A to 58D to their corresponding imaging points are determined by the controller CNT2. These amounts of positional deviation are stored into the database unit 52 as the distortion data of the second projection exposure apparatus SR2. Here, a projection pattern 60 obtained as the adjacent imaging points 60a, 60b, . . . , 60d are connected together has a barrel form, thereby indicating that the projection optical system PL2 of the second projection exposure apparatus SR2 has a barrel type distortion.

Next, in the first projection exposure apparatus SR1 in FIG. 8, the reticle R1 is loaded, the wafer W is loaded onto the wafer stage ST1, and each shot area of the wafer W is exposed to the pattern image of the reticle R1 in a step-and-repeat method. Here, it is assumed that, in addition to a circuit pattern, cruciform alignment marks are formed within the pattern area PA1 of the reticle R1 respectively at positions corresponding to the imaging characteristic measuring marks 53B, 53F, 53H, and 53D of the test reticle R in FIG. 9A.

Figure 9B:
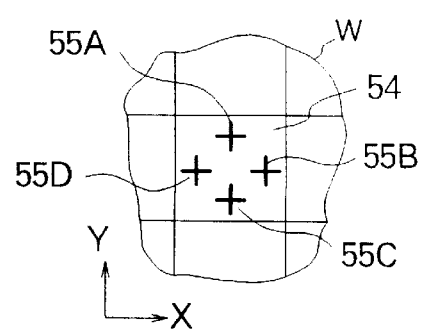
FIG. 9B is a partial plan view showing an arrangement of wafer marks formed in a shot area of a wafer.

Then, after the wafer W is subjected to processing steps such as development, etching, and film-forming steps, this wafer W is loaded onto the wafer stage ST2 in the second projection exposure apparatus SR2, while the reticle R2 is loaded. The wafer W is pre-aligned, for example, with reference to its outer shape. As shown in FIG. 9B, four pieces of cruciform wafer marks 55A to 55D are formed at each shot area 54. Here, orthogonal directions of movement of the wafer stage ST2 in the second projection exposure apparatus SR2 are assumed to be X and Y directions.

Prior to exposure, the controller CNT2 of the second projection exposure apparatus SR2 takes in the distortion data of two projection exposure apparatuses SR1 and SR2 from the database unit 52 by way of the host computer 51. As shown in FIGS. 10A and 10B, these data are represented as the amounts of positional deviation of the projection patterns 59 and 60 with a magnification β each at eight measurement points 57A to 57D and 58A to 58D. Also, as shown in FIG. 10C, the controller CNT2 determines a correction amount Δβ of magnification which minimizes the overlay error between the projection pattern 59 at the eight measurement points 57A to 57D and 58A to 58D and a pattern 60A obtained after the magnification β of the projection pattern 60 generated by the second projection exposure apparatus SR2 is corrected to (β+Δβ).

Figure 10C:
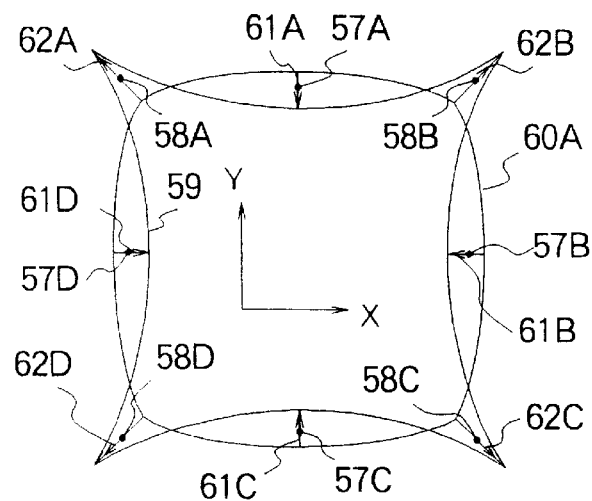

Specifically, in FIG. 10C, a vector 61A from an imaging point on the projection pattern 60A corresponding to the measurement point 57A to its corresponding imaging point on the projection pattern 59 becomes a vector of the amount of positional deviation at this measurement point 57A. This vector comprises components respectively directed to X and Y directions. Similarly, at the other measurement points 57B to 57D and 58A to 58D, vectors of positional deviation amounts 61B to 61D and 62A to 62D are respectively obtained. The correction amount $\Delta\beta$ of magnification is determined so as to minimize the sum of squares of absolute values of these vectors. Thus determined correction amount $\Delta\beta$ of magnification and the vectors 61A to 61D and 62A to 62D at this time are referred to as "distortion matching data" and stored into a storage section within the controller CNT2.

Here, the above-mentioned distortion matching data may be determined at the host computer 51 having a higher operating capacity. Further, thus determined distortion matching data may be stored in the database unit 52 so as to be repeatedly used until they are updated.

Thereafter, the second projection exposure apparatus SR2 in FIG. 8 uses the alignment sensor AS2 so as to measure coordinates of the four wafer marks 55A to 55D shown in FIG. 9B in X and Y directions in a predetermined number of shot areas (sample shots) selected on the wafer W.

Figure 11A:
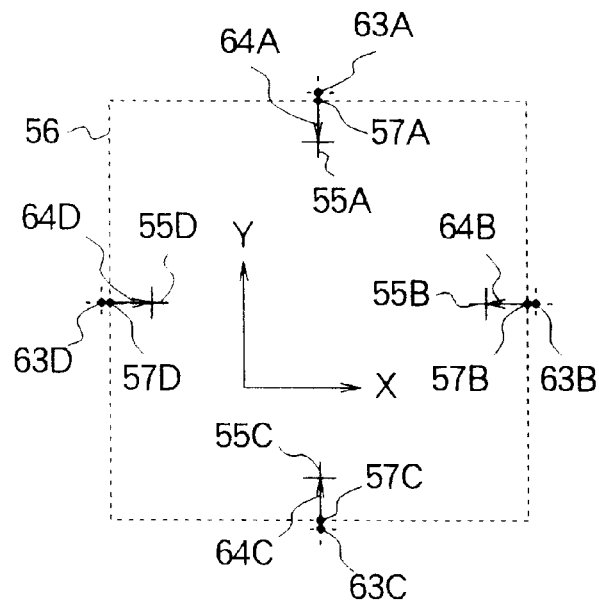
FIG. 11A is an enlarged view showing a result of measurement of wafer marks in a second projection exposure apparatus.
Figure 11B:
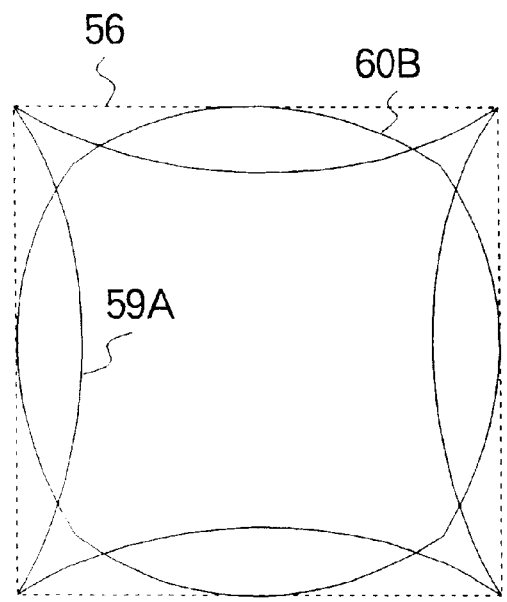
FIG. 11B is an explanatory view showing a state in which a virtual projection pattern of a first layer and a virtual projection pattern of a second layer are overlaid with each other.
Figure 12:
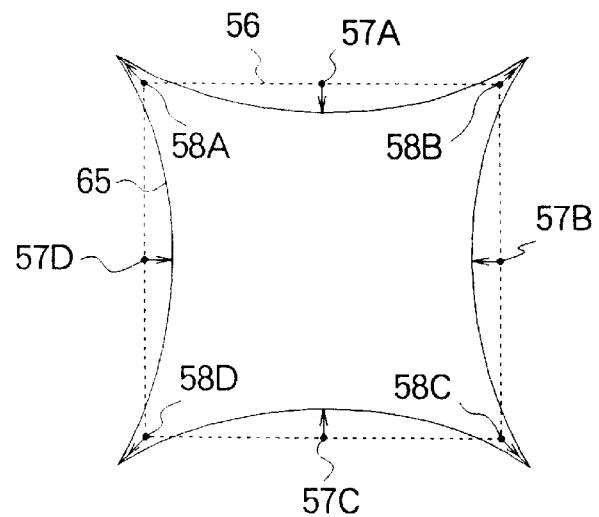
FIG. 12 is an explanatory view showing an example of distortion of a projection image in a conventional projection exposure apparatus.
Figure 13A:
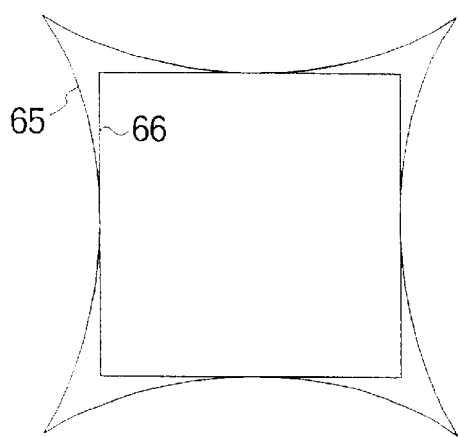
FIGS. 13A and 13B are explanatory views showing a state of two layers overlaid with each other when exposure is performed by a conventional mix-and-match method.
Figure 13B:
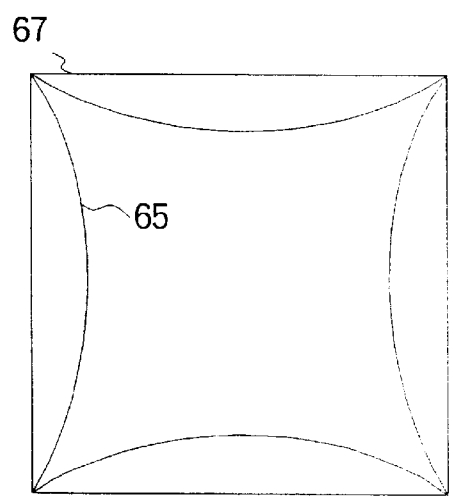

FIG. 11A shows the result of measurement of the four wafer marks 55A to 55D in a certain shot area on the wafer W. In FIG. 11A, the measurement points 57A to 57C on the square reference pattern 56 respectively correspond to positions of projection of the wafer marks 55A to 55C in the case where the projection optical system PL1 of the first projection exposure apparatus SR1 has a magnification exactly at $\beta$ while being free of distortion and linear magnification error. Further, dotted cruciform marks 63A to 63D respectively indicate images of wafer marks formed when the pattern of the reticle R1 for the first layer is projected onto the wafer W by way of the projection optical system PL2 of the second projection exposure apparatus SR2 while the magnification of the projection optical system PL2 is set at $(\beta+\Delta\beta)$. The coordinates of the marks 63A to 63D are computed by the controller CNT2 from the above-mentioned distortion matching data and its own distortion data.

Thereafter, the controller CNT2 determines X and Y components of vectors 64A to 64D directed from the marks 63A to 63D to their corresponding wafer marks 55A to 55D. For example, assuming that the absolute value of the vector 61A at the measurement point 57A in FIG. 10C is dA, the absolute value of the vector 64A at the measurement point 57A in FIG. 11A is dB, and the image height of the measurement point 57A is D, the controller CNT2 determines a correction amount $\Delta\beta'$ of magnification in the projection optical system PL2 for minimizing the overlay error between the first and second layers on the wafer W according to the following approximate expression. This correction amount $\Delta\beta'$ of magnification also includes influence of expansion or contraction of the wafer W itself caused when it is subjected to a variety of processes.

$$\Delta\beta'=1+(dA-dB)/D$$

Accordingly, the final magnification of the projection optical system PL2 becomes $(\beta+\Delta\beta)\Delta\beta'$. Therefore, the controller CNT2 of FIG. 8 sets the magnification of the projection optical system PL2 to $(\beta+\Delta\beta)\Delta\beta'$ by way of the pressure adjuster BC2.

Here, in order to determine a correction value for the final magnification of the projection optical system PL2, it is desirable to use a mean value of differences in absolute values between all the vectors 61A to 61D in FIG. 10C and their corresponding vectors 64A to 64D in FIG. 11A. In order to further improve the averaging effects, a mean value of results of measurement concerning all the sample shots are desirably used. Also, since the rotational angle of each sample shot is detected in the in-shot multipoint alignment measurement of this embodiment, overlay accuracy is further improved when the reticle R2 is rotated in response to the mean value of the rotational angles.

Thereafter, the controller CNT2 statistically processes the arrangement coordinates of the wafer marks in each sample shot so as to compute the arrangement coordinates of all the shot areas on the wafer W, sequentially positions the respective shot areas at the exposure position on the basis of thus computed arrangement coordinates, and then expose them to the pattern image of the reticle R2 by way of the projection optical system PL2. Accordingly, if the original circuit pattern at the first layer on the wafer W is the reference pattern 56 shown in FIG. 11B, the actual projection image formed by the first projection exposure apparatus SR1 will become a projection pattern 59A, while the projection image of the same pattern formed by the second projection exposure apparatus SR2 will become a projection pattern 60B, thereby minimizing overlay error between the two layers on the wafer W.

Subsequently, when the third or later layer on the wafer is exposed to light by use of a projection exposure apparatus different from that of the preceding layer, as the magnification is corrected according to the calculation of distortion matching data and the result of in-shot multipoint alignment measurement for each projection exposure apparatus, overlay error between different layers on the wafer can be held with a high accuracy. Also, though in-shot multipoint alignment measurement has originally been used for correcting errors in magnification (chip magnification) of the pattern within each shot area and rotation (chip rotation) of each shot area, the chip magnification can be corrected more accurately according to this embodiment.

In the foregoing example, as shown in FIGS. 10A to 10C, a correction amount of magnification in the second projection exposure apparatus for minimizing the overlay error caused by two projection exposure apparatuses is determined beforehand as distortion matching data. Alternatively, the state of distortion of the projection image caused by the first projection exposure apparatus may be determined from the result of positional measurement of the wafer marks 55A to 55D shown in FIG. 11A and the distortion data of FIG. 10A, and the correction amount of magnification in the second projection exposure apparatus may be directly determined so as to minimize the overlay error with respect to this projection image.

Also, the present invention is applicable not only to the case where a stepper type (collective exposure type) projection exposure apparatus is used but also to a case where a projection exposure apparatus of scanning exposure type such as step-and-scan type, in which a reticle and a wafer are synchronously scanned with respect to the projection optical system, is used.

Thus, without being restricted to the foregoing embodiments, the present invention can attain a variety of configurations as long as they do not deviate from the gist of the present invention.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Applications No.235690/1995 filed on Sep. 13, 1995 and No.250486/1995 filed on Sep. 28, 1995 are hereby incorporated by reference.

What is claimed is:

1. An exposure method in which a plurality of reticle patterns are sequentially overlaid with and projected onto a plurality of shot areas formed on a substrate to be processed, said method comprising the steps of:

measuring positions of a plurality of alignment marks formed within said shot areas;

computing, from thus measured positions of alignment marks and designed position of the alignment marks, an error therebetween;

comparing known distortion data of a plurality of projection lenses and said error with each other so as to specify the projection lens used for forming the alignment marks;

using the distortion data of thus specified projection lens and said error so as to correct a projection image of a reticle pattern; and performing exposure with thus corrected projection image.

2. An exposure method according to claim 1, wherein at least one of magnification of the projection image of the reticle pattern and rotation of the projection image of the reticle pattern is adjusted so as to correct said projection image.

3. An exposure method according to claim 1, further comprising a step of extracting, from said error, a non-linear component thereof, wherein thus extracted non-linear component of the error and the known distortion data of the plurality of projection lenses are compared with each other so as to specify the projection lens used for forming the alignment marks.

4. A method according to claim 1, wherein a micro-device is fabricated by exposing the reticle pattern onto the substrate.

5. An exposure method in which a reticle pattern is projected to a substrate to be processed, said method comprising the steps of:

measuring positions of a plurality of alignment marks formed within said substrate;

computing, from thus measured positions of the alignment marks and designed positions of the alignment marks, an error therebetween; and determining, from a predetermined distortion data of a projection lens used for forming said alignment marks and said error, an amount of positional deviation of a projection image of a reticle pattern.

6. A method according to claim 5, wherein a micro-device is fabricated by exposing the reticle pattern onto the substrate.

7. An exposed method in which a predetermined mark is exposed to a substrate by way of a projection optical system, said method comprising the steps of:

detecting information regarding a position of alignment marks formed on said substrate;

extracting a non-linear component from the detected information; and determining image characteristics of said projection optical system used for forming said alignment mark based on said extracted non-linear component.

8. An exposure method according to claim 7, wherein said image characteristics includes a distortion characteristic.

9. A method according to claim 7, wherein a micro-device is fabricated by exposing the reticle pattern onto the substrate.

10. A method of detecting a mark in which a mark formed on a substrate by way of a projection optical system is detected, said method comprising the steps of:

detecting information regarding a position of said mark; and correcting said information regarding a position of said mark based on characteristics information regarding an image of said projection optical system which formed said mark.

11. A method according to claim 10, wherein a plurality of shots are formed on said substrate and a plurality of alignment marks of each of said shots are detected.

12. A method according to claim 11, wherein at least one of magnification, rotation and distortion of each of said shots is detected by the detected alignment mark of each of said shots.

13. A method according to claim 10, wherein a micro-device is fabricated by exposing a predetermined pattern onto the substrate which is positioned based on said information detected and corrected.

14. An exposure method in which a plurality of reticle patterns are sequentially overlaid with and projected onto a plurality of shot areas formed on a substrate to be processed, the method comprising the steps of:

obtaining information regarding positions of a plurality of marks formed in said plurality of shot areas;

obtaining distortion information regarding distortions in previous shot areas based on said position information; and adjusting a pattern image of said reticle based on said position and distortion information.

15. An exposure method according to claim 14, wherein said distortion information includes information regarding distortion of a projection optical system used in formation of plurality of shot areas.

16. An exposure method according to claim 14, wherein the adjusting step includes adjustment of a magnification of said pattern image.

17. An exposure method according to claim 16, wherein the adjusting step includes adjusting in relative rotation between pattern image and said plurality of shot areas.

18. An exposure method according to claim 15, wherein said information regarding the distortions is selected from pre-stored distortion data of a plurality of projection optical systems.

19. An exposure method according to claim 14, wherein said plurality of alignment marks are used for adjusting relative positional relationships between said pattern image of said reticle and said plurality of shot areas.

20. An exposure method according to claim 17, wherein said plurality of alignment marks are used for adjusting relative positional relationships between said pattern image of said reticle and said plurality of shot areas.

21. A method according to claim 14, wherein a micro-device is fabricated by exposing the reticle pattern onto the substrate.

22. An exposure method in which a plurality of reticle patterns are sequentially overlaid with and projected onto a plurality of shot areas formed on a substrate to be processed, the method comprising the steps of:

measuring positions of a plurality of alignment marks formed with said plurality of shot areas;

computing, from the measured positions and from designed positions of said plurality of alignment marks, an error therebetween;

comparing known distortion data of a plurality of projection lenses and said error with each other so as to specify one of said plurality of projection lens to be used for forming the plurality of alignment marks;

using the distortion data of the specified projection lens and said error so as to correct a projection image of a reticle pattern; and performing exposure with the corrected projection image.

23. An exposure method according to claim 22, wherein at least one of magnification of the projection image of the reticle pattern and rotation of the projection image of the reticle pattern is adjusted so as to correct the projection image.

24. An exposure method according to claim 22, further comprising a step of extracting, from said error, a non-linear component thereof,
wherein the extracted non-linear component of said error and the known distortion data of said plurality of projection lenses are compared with each other so as to specify the one of said plurality of projection lenses used for forming said plurality of alignment marks.

25. A method according to claim 22, wherein a microdevice is fabricated by exposing the reticle pattern onto the substrate.

26. An exposure method in which a plurality of reticle patterns are sequentially overlaid with and projected, by a plurality of exposure apparatuses, onto a plurality of shot areas formed on a substrate to be processed, the method comprising the steps of:
determining distortion data of projection images respectively formed by said plurality of exposure apparatuses;
storing the determined distortion data;
determining an amount of positional deviation of the projection image of the first reticle pattern formed by the first exposure apparatus at a fixed measurement point on said substrate before exposure of a second layer on said substrate is performed by the second exposure apparatus;
correcting, based on the stored distortion data and the amount of positional deviation, the projection image formed by said second exposure apparatus; and
performing exposure by said second exposure apparatus with the corrected projection image and, at the correcting step, an amount of correction for the projection image formed by said second exposure apparatus at which overlay accuracy between the respective projection images formed by said first and second exposure apparatuses is optimized is determined from the stored distortion data and, based on amounts of positional deviation in the projection images in said first and second exposure apparatuses at the determined amount of the projection image of said first reticle pattern, the projection image formed by said second exposure apparatus is corrected.

27. An exposure method according to claim 22, wherein, at the correcting step, an amount of correction for the projection image formed by said second exposure apparatus at which overlay accuracy between the respective projection images formed by said first and second exposure apparatuses is optimized is determined from the stored distortion data and, based on amounts of positional deviation in the projection images in said first and second exposure apparatuses at the determined amount of the projection image of said first reticle pattern, the projection image formed by said second exposure apparatus is corrected.

28. A method according to claim 26, wherein a microdevice is fabricated by exposing the reticle pattern onto the substrate.

29. An exposure method for exposing a predetermined pattern onto a substrate by way of a projection system, said method comprising the steps of:
measuring a mark formed on the substrate;
obtaining first information regarding a position of the mark based on the measuring result;
obtaining second information which includes known characteristics regarding a projection image projected onto the substrate when the mark is formed, the second information being obtained based on said first information; and
controlling projection of the predetermined pattern onto the substrate based on the first and second information.

30. An exposure method according to claim 29, wherein said first information includes deviation information between measured position of the mark and designed position of the mark.

31. An exposure method according to claim 30, wherein said second information obtaining step includes:
accessing a memory which has a plurality of said second specific information respectively corresponding to a plurality of projection systems;
comparing said second information of a plurality of the projection system and said first information with each other so as to specify the projection system using for forming the mark; and
specifying said second information corresponding to said specified projection system.

32. An exposure method according to claim 30, wherein said controlling step includes:
determining a position deviation of a projection image of said predetermined pattern based on said deviation information and said second information; and
controlling a projection position on the substrate of said predetermined pattern based on said positional deviation determined by the determining step.

33. An exposure method according to claim 29, wherein said second information includes a distortion information of a projection system which projected the mark onto the substrate.

34. An exposure method according to claim 29, wherein said controlling step includes adjusting a projection image of said predetermined pattern.

35. An exposure method according to claim 34, wherein said adjusting step includes controlling magnification of the projection system.

36. An exposure method according to claim 29, wherein said controlling step includes controlling a projection position of said predetermined pattern on the substrate.

37. An exposure method according to claim 29, wherein said second information includes a distortion information of a projection system that projected the mark onto the substrate, and controlling step includes correcting said first information based on said second information.

38. An exposure method according to claim 29, wherein said mark is exposed onto the substrate by a first exposure apparatus, and said predetermined pattern is exposed onto the substrate by a second exposure apparatus different from the first exposure apparatus.

39. An exposure method according to claim 38, wherein said second information includes known first characteristics information that a projection image projected by said first exposure apparatus has, and further comprising:
obtaining known second characteristics information that a projection image projected by said second exposure apparatus has.

40. An exposure method according to claim 39, wherein said controlling step includes:
adjusting a projection image that is projected by said second exposure apparatus based on said first information, said first characteristics information and said second characteristics information.

41. An exposure method according to claim 40, wherein said adjusting step includes controlling magnification of the projection image.

42. An exposure method according to claim 29, further comprising the steps of:

measuring said second information; and storing said second information measured by the measuring step.

43. A method for fabricating a micro-device by exposing the predetermined pattern onto the substrate using the exposure method according to claim 29.

44. A projection exposure apparatus which exposes a predetermined pattern on to a substrate by way of a projection system, said apparatus comprising:

a first obtaining unit, having a observing system that observes said substrate, which measures a mark formed on the substrate by the observing unit and obtains first information regarding to position of the mark;

a second obtaining unit, which is electrically connected to a memory, and which obtains second information that corresponds to known characteristics with respect to a projection image projected onto the substrate when the mark is formed, the second information being obtained based on said first information; and a controller, which is electrically connected to said first and second obtaining unit, and which controls projection of the predetermined pattern onto the substrate based on the first and second information.

45. An apparatus according to claim 44, wherein said mark is exposed onto the substrate by a predetermined exposure apparatus different from said projection exposure apparatus.

46. An apparatus according to claim 45, wherein said second information includes known first characteristics information that a projection image projected by said predetermined exposure apparatus has, and further comprising:

a third obtaining unit, which is electrically connected to said memory, and which obtains known second characteristics information that a projection image projected by said projection exposure apparatus has, and wherein said controller adjusts a projection image that is projected by said projection exposure apparatus based on said first information, said first characteristics, said first characteristics information and said second characteristics information.

47. An apparatus according to claim 46, wherein said controller controls magnification of the projection image.

48. An apparatus according to claim 44, wherein said memory includes a data-base device that is electrically connected to said projection exposure apparatus.

49. An apparatus according to claim 44, wherein said memory is arranged in said projection exposure apparatus.

50. An apparatus according to claim 44, wherein said memory has a plurality of specific information respectively corresponding to a plurality of exposure apparatuses, said second obtaining unit further comprising:

a comparator, which is electrically connected to said first obtaining unit and said memory, and which compares a plurality of said second information and said first information with each other so as to specify one second information.

51. An apparatus according to claim 50, wherein said first information includes deviation information between measured position of the mark and designed position of the mark.

52. An apparatus according to claim 44, wherein said second information includes a distortion information of a projection system which projected the mark onto the substrate.

53. An apparatus according to claim 44, wherein said controller controls magnification of the projection image of the predetermined pattern.

54. An apparatus according to claim 44, wherein said controller controls projection position of said predetermined pattern on the substrate.

55. A micro-device manufactured by exposing the predetermined pattern onto the substrate via the projection exposure apparatus of claim 44.

* * * * *